US012648484B2

(12) United States Patent
Hou et al.

(10) Patent No.: US 12,648,484 B2
(45) Date of Patent: Jun. 2, 2026

(54) ELECTRONIC DEVICE

(71) Applicants:Advanced Semiconductor Engineering, Inc., Kaohsiung (TW); UNIVERSAL SCIENTIFIC INDUSTRIAL (SHANGHAI) CO., LTD., Shanghai (CN)

(72) Inventors: Yi-Hung Hou, Kaohsiung (TW); Yung-Fa Chen, Nantou County (TW); Sheng-Chia Chen, Nantou County (TW)

(73) Assignees: Advanced Semiconductor Engineering, Inc., Kaohsiung (TW); UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 661 days.

(21) Appl. No.: 17/984,187

(22) Filed: Nov. 9, 2022

(65) Prior Publication Data

US 2024/0153920 A1    May 9, 2024

(51) Int. Cl.
*H10W 90/00* (2026.01)
*H10W 70/40* (2026.01)
*H10W 72/00* (2026.01)

(52) U.S. Cl.
CPC ......... *H10W 90/00* (2026.01); *H10W 70/421* (2026.01); *H10W 70/442* (2026.01); *H10W 70/461* (2026.01); *H10W 90/811* (2026.01); *H10W 70/417* (2026.01); *H10W 72/884* (2026.01); *H10W 90/736* (2026.01); *H10W 90/756* (2026.01)

(58) Field of Classification Search
CPC ......... H01L 23/49537; H01L 23/49541; H01L 23/49568; H01L 23/49575; H01L 23/49513; H01L 23/367; H01L 23/492; H01L 23/49524; H01L 23/49562; H01L 24/32; H01L 24/48; H01L 24/73; H01L 24/33; H01L 24/41; H01L 25/071; H01L 25/072; H01B 5/00; H05K 7/2039; H10W 72/884; H10W 70/421; H10W 70/442; H10W 70/461; H10W 70/417; H10W 90/00; H10W 90/811; H10W 90/736; H10W 90/756

See application file for complete search history.

(56) References Cited

U.S. PATENT DOCUMENTS 6,826,053 B2    11/2004  Kato et al.
8,878,347 B2    11/2014  Kadoguchi et al.
(Continued)

FOREIGN PATENT DOCUMENTS

CN        103534805 B      8/2016

OTHER PUBLICATIONS

U.S. Appl. No. 17/731,203, filed Apr. 27, 2022, Liu et al.

*Primary Examiner* — Omar F Mojaddedi
(74) *Attorney, Agent, or Firm* — Foley and Lardner LLP

(57) ABSTRACT

An electronic device is disclosed. The electronic device includes a first conductive plate and a first electronic component. The first conductive plate includes a first connecting portion. The first electronic component supports the first conductive plate through the first connecting portion. The first connecting portion is electrically connected to the first electronic component and configured to buffer stress from the first conductive plate to the first electronic component.

18 Claims, 19 Drawing Sheets

(56)     References Cited

U.S. PATENT DOCUMENTS

| | | | |
|---|---|---|---|
| 10,980,151 B2 * | 4/2021 | Bala | H05K 7/20454 |
| 11,302,646 B2 | 4/2022 | Hsieh et al. | |
| 2002/0056922 A1 * | 5/2002 | Funaya | H01L 24/11 |
| | | | 438/117 |
| 2006/0215368 A1 * | 9/2006 | Tsai | H01L 23/433 |
| | | | 257/E23.09 |
| 2008/0002367 A1 * | 1/2008 | Gilliland | H01L 23/552 |
| | | | 257/E23.114 |
| 2009/0261472 A1 * | 10/2009 | Bayerer | H01L 24/06 |
| | | | 257/E23.101 |
| 2009/0302444 A1 * | 12/2009 | Ueda | H01L 25/117 |
| | | | 438/109 |
| 2010/0157541 A1 * | 6/2010 | Zhu | H01L 23/433 |
| | | | 361/710 |
| 2012/0200281 A1 | 8/2012 | Herbsommer et al. | |
| 2014/0090816 A1 * | 4/2014 | Yang | F28D 15/02 |
| | | | 165/104.26 |
| 2022/0238457 A1 | 7/2022 | Hsieh et al. | |
| 2023/0283278 A1 | 9/2023 | Wang et al. | |
| 2024/0153920 A1 | 5/2024 | Hou et al. | |

* cited by examiner

100

11

12

13

43 33

12o3

53

63

13o1

61

12o1

51

31 41

44 34

54

12o4

64

13o2

62

52

12o2

32 42

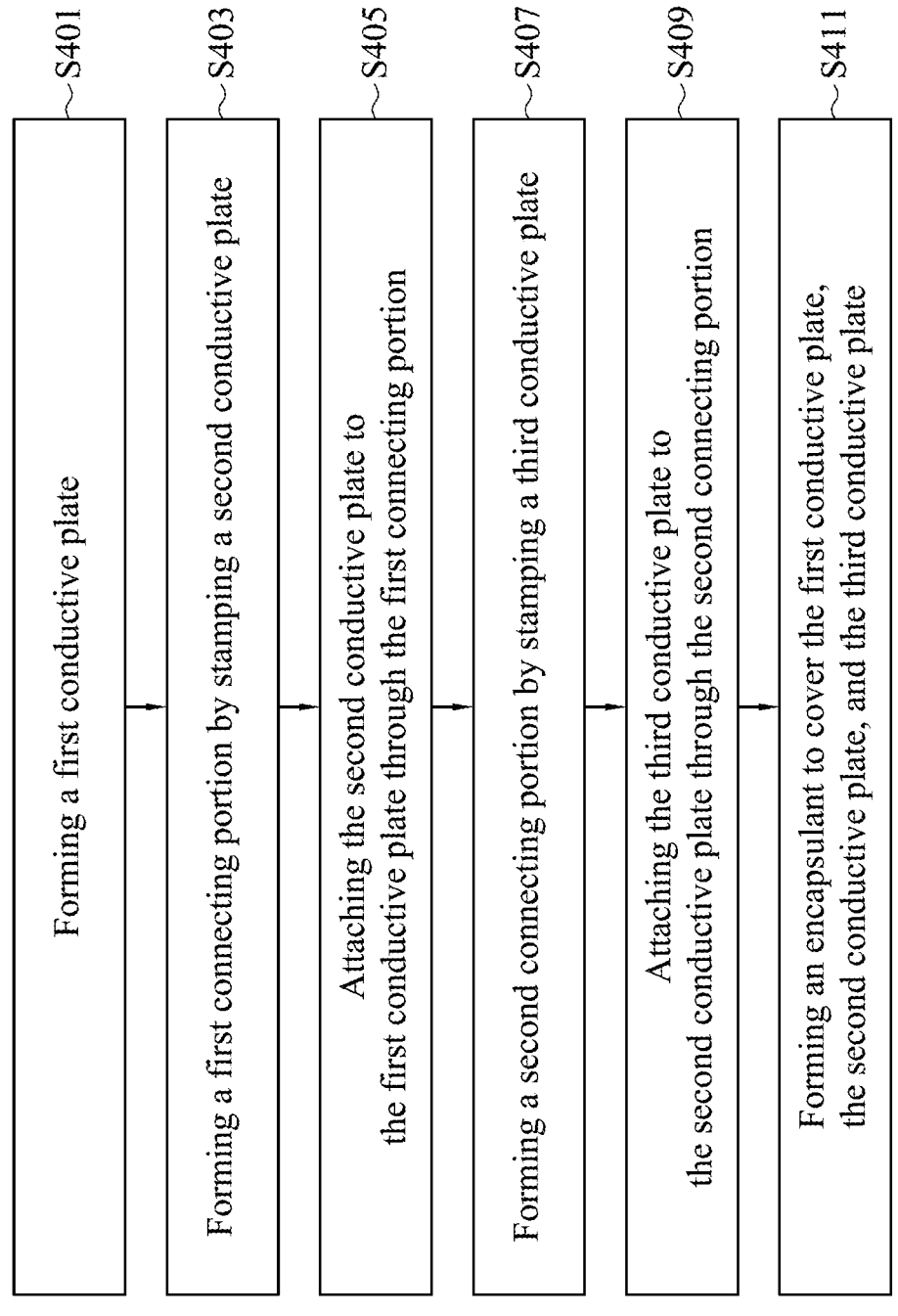

S401
Forming a first conductive plate

S403
Forming a first connecting portion by stamping a second conductive plate

S405
Attaching the second conductive plate to the first conductive plate through the first connecting portion S407
Forming a second connecting portion by stamping a third conductive plate S409
Attaching the third conductive plate to the second conductive plate through the second connecting portion S411
Forming an encapsulant to cover the first conductive plate, the second conductive plate, and the third conductive plate

ELECTRONIC DEVICE

BACKGROUND

1. Field of the Disclosure

The present disclosure relates to an electronic device, and in particular to an electronic device including a conductive plate.

2. Description of the Related Art

As power from power modules increases to fulfill higher charge rates, heat dissipation becomes more challenging.

SUMMARY

In some embodiments, an electronic device includes a first conductive plate and a first electronic component. The first conductive plate includes a first connecting portion. The first electronic component supports the first conductive plate through the first connecting portion. The first connecting portion is electrically connected to the first electronic component and configured to buffer stress from the first conductive plate to the first electronic component.

In some embodiments, an electronic device includes a first electronic component, a first conductive plate, and a second conductive plate. The first conductive plate is disposed over the first electronic component. The second conductive plate is disposed under the first electronic component and has a first clip configured to buffer stress from the conductive plate to the first electronic component.

In some embodiments, an electronic device includes a first conductive plate and a first electronic component. The first conductive plate includes a first connecting portion. The first electronic component supports the first conductive plate through the first connecting portion. The first connecting portion has a section non-perpendicular to the first electronic component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 16 is a flowchart of an exemplary method of manufacturing an electronic device according to some embodiments of the present disclosure.

DETAILED DESCRIPTION

Figure 1:
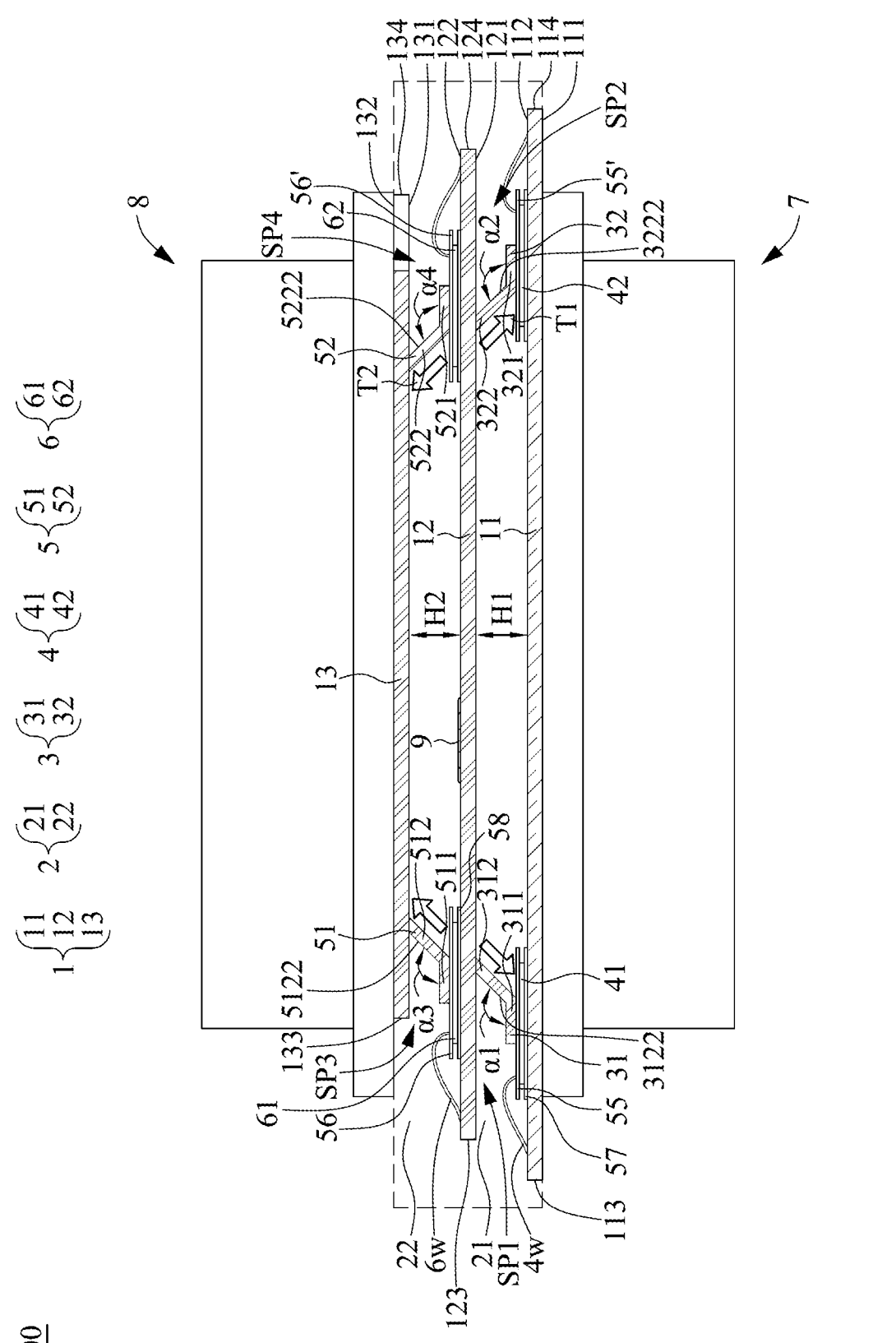
FIG. 1 is a perspective side view of an exemplary electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for purposes of simplicity and clarity and does not in itself dictate a relationship between the various embodiments and/or configurations discussed.

Figure 2:
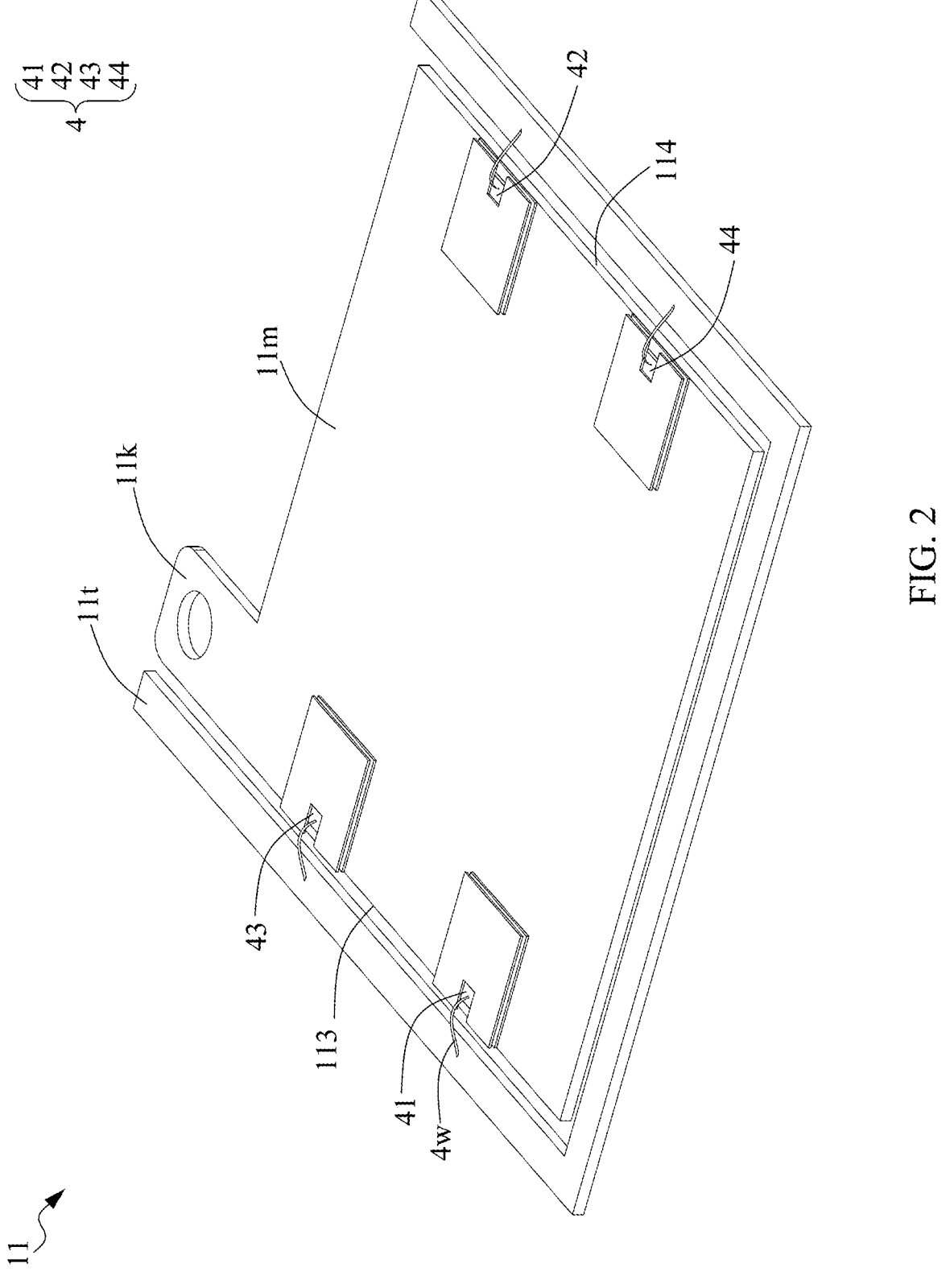
FIG. 2 is a 3D (three dimensional) view of a portion of an exemplary electronic device according to some embodiments of the present disclosure.
Figure 3:
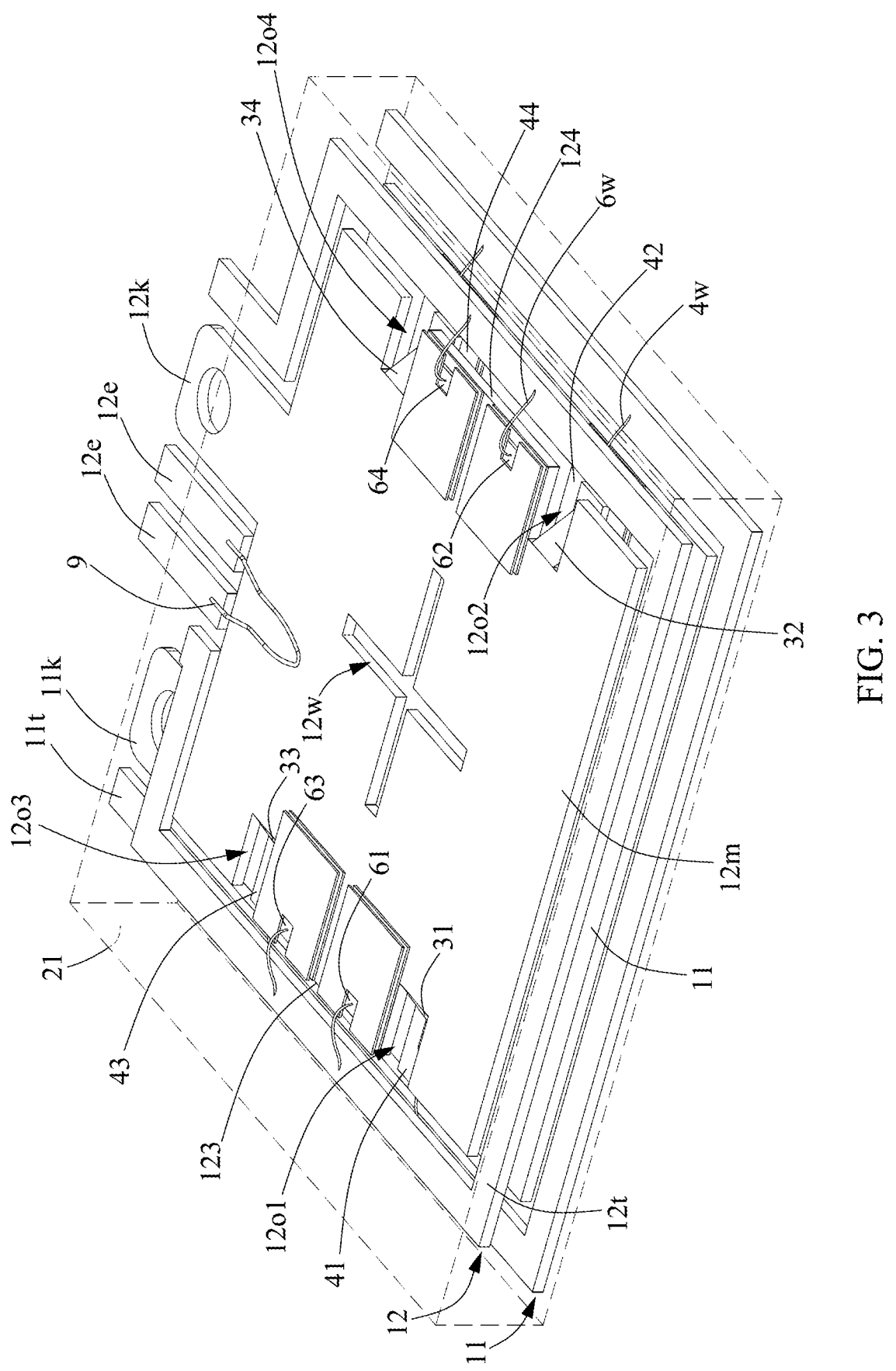
FIG. 3 is a 3D view of a portion of an exemplary electronic device according to some embodiments of the present disclosure.
Figure 4:
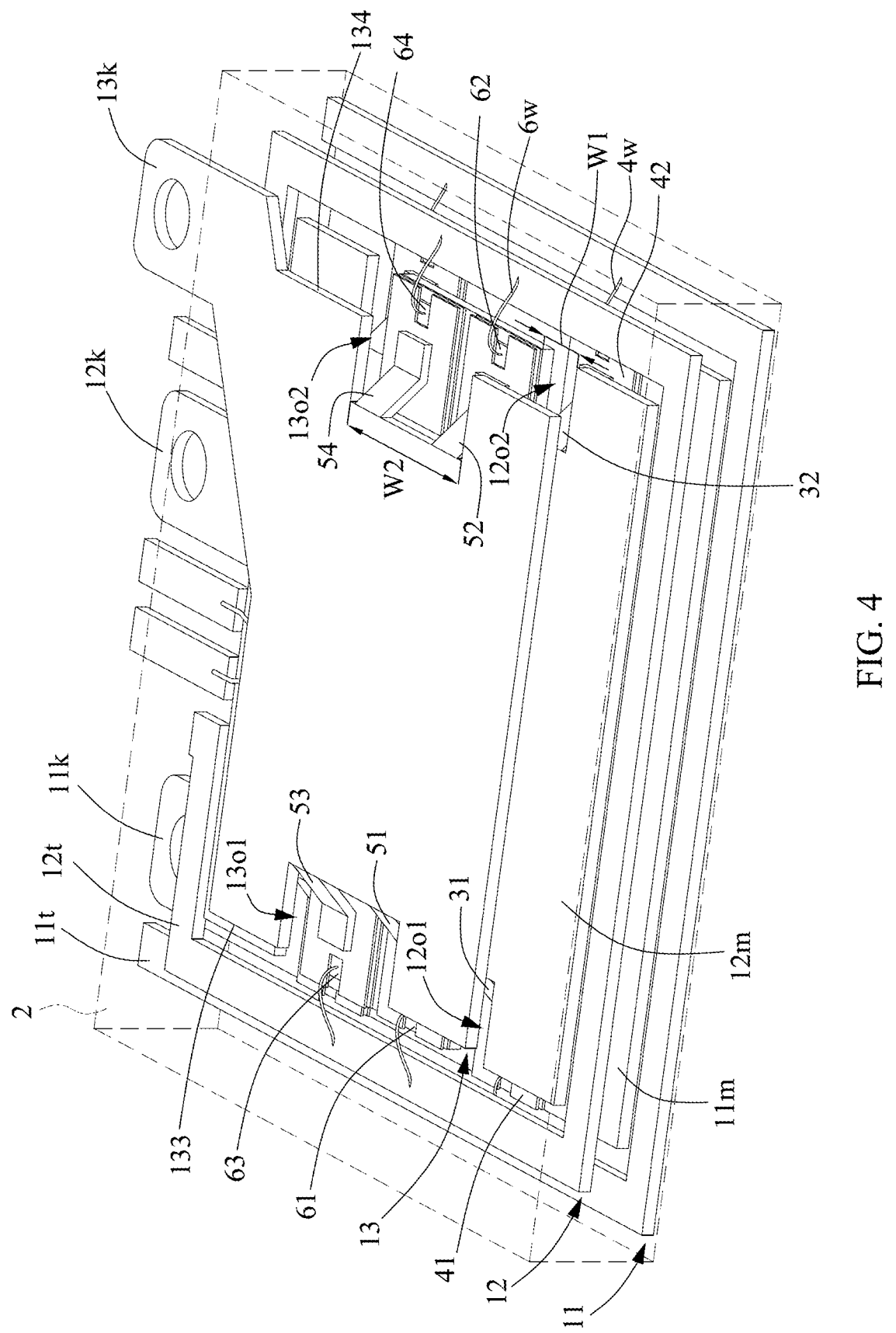
FIG. 4 is a 3D view of a portion of an exemplary electronic device according to some embodiments of the present disclosure.

FIG. 1 is a perspective side view of an exemplary electronic device (or a power module) 100 according to some embodiments of the present disclosure. FIG. 2 is a 3D view of a portion of the electronic device 100 according to some embodiments of the present disclosure. FIG. 3 is a 3D view of a portion of the electronic device 100 according to some embodiments of the present disclosure. FIG. 4 is a 3D view of a portion of the electronic device 100 according to some embodiments of the present disclosure. The power module 100 may include conductive plates 11, 12, and 13, a protective layer 2, a plurality of connecting portions 3, a plurality of electronic components (or units) 4, a plurality of connecting portions 5, a plurality of electronic components (or units) 6, a first heat dissipation structure 7, a second heat dissipation structure 8, and a thermistor 9. The exploded view as illustrated in FIG. 2 may exclude the protective layer 2, the first heat dissipation structure 7, and a second heat dissipation structure 8, for purposes of simplicity.

As shown in FIG. 1, the conductive plate 12 may be disposed above the conductive plate 11. The conductive plate 13 may be disposed above the conductive plate 12. The conductive plate 11 may have a surface (or a side) 111 and a surface (or a side) 112 opposite to the surface 111. The surface 111 may face the first heat dissipation structure 7. The surface 111 may face away from the conductive plate 12 and be exposed by the protective layer 2. The surface 112 may face the conductive plate 12. The conductive plate 12 may have a surface (or a side) 121 and a surface (or a side) 122 opposite thereto. The surface 121 may face the conductive plate 11. The surface 122 may face the conductive plate 13. The conductive plate 13 may have a surface (or a side) 131 and a surface (or a side) 132 opposite to the surface 111. The surface 132 may face the second heat dissipation structure 8. The surface 132 may face away from the conductive plate 12 and exposed by the protective layer 2.

As shown in FIG. 1 a distance H1 between the conductive plate 11 and the conductive plate 12 may be substantially equal to a distance H2 between the conductive plate 12 and the conductive plate 13.

In some embodiments, the conductive plate 11, the conductive plate 12, and the conductive plate 13 may each include conductive materials, such as copper (Cu), tin (Sn), aluminum (Al), gold (Au), silver (Ag), tungsten (W), nickel (Ni), iron (Fe), or other suitable materials.

As shown in FIG. 2, the conductive plate 11 may have an end portion 11$k$ exposed by the protective layer 2. The end portion 11$k$ of the conductive plate 11 may protrude from a body portion 11$m$ thereof. The end portion Ilk of the conductive plate 11 may have a keyhole configured to secure the conductive plate 11 to an external substrate. The conductive plate 11 may include a first conductive trace (e.g., a part) 11$t$ disposed around and at the same elevation as the body portion 11$m$ of the conductive plate 11. The part 11$t$ may be spaced apart from the body portion 11$m$.

The plurality of electronic components 4 may be disposed between the conductive plate 11 and the conductive plate 12. The plurality of electronic components 4 may be disposed above the conductive plate 11. The plurality of electronic components 4 may be disposed over the body portion 11$m$ of the conductive plate 11 and electrically connect to the part 11$t$ of the conductive plate 11. The electronic device 100 may include a plurality of wirings 4$w$ each connecting one of the electronic components 4 to the first conductive trace 11$t$ of the conductive plate 11. The part 11$t$ of the conductive plate 11 comprises a common electrode electrically connected to a gate terminal of each of the transistors of the electronic components 4. The wirings 4$w$ may include a bond wire or be formed by a wire-bonding apparatus. Each of the electronic components 4 may include a first transistor having a drain terminal connected to the conductive plate 11. In other words, the conductive plate 11 connects the drain terminal of each the electronic components 4. The first transistor of each of the electronic component 4 may have a gate terminal connected to the conductive trace 11$t$ through the wrings 4$w$, and a source terminal connected to a corresponding one of the plurality of connecting portions 3, which may be connected to the conductive plate 12. In other words, the conductive plate 12 connects the source terminal of each the electronic components 4. The first transistor may be an insulated gate bipolar transistor (IGBT) or a power transistor. In some embodiments, the electronic components 4 may be units which are derived or obtained from a wafer or a panel by singulation process. Each of the units 4 may include a semiconductor chip or die.

As shown in FIG. 2, the plurality of electronic components 4 may be arranged along an edge of the body portion 11$m$ of the conductive plate 11. In some embodiments, the conductive plate 11 (or the body portion 11$m$) may have a first edge 113 and a second edge 114 distinct from the first edge 113. The first edge 113 may be opposite to the second edge 114. The part 11$t$ of the conductive plate 11 may be arranged along the first edge 113 and the second edge 114 of the conductive plate 11. The electronic components 4 include electronic components 41 and 43 arranged at the first edge 113 of the conductive plate 11 and electronic components 42 and 44 arranged at the second edge 114 of the conductive plate 11. The electronic components 41 and 43 may be spaced apart from each other. The electronic components 42 and 44 may be spaced apart from each other. The conductive plate 11 may be disposed under the electronic components 4 (or electronic components 41 and 42). The conductive plate 12 may be disposed above the electronic components 4 (or electronic components 41 and 42).

The number of the plurality of electronic components 4 may be 4 (four) as shown in FIG. 2. Alternatively, the number thereof may be varied, for example, 2, 8, or more.

As shown in FIG. 3, the conductive plate 12 may have an end portion 12$k$ exposed by the protective layer 2. The protective layer 2 of the electronic device 100 as illustrated in FIG. 3 may be shown with a dashed line for purposes of explanation. The end portion 12$k$ of the conductive plate 12 may protrude from a body portion 12$m$ thereof. The end portion 12$k$ of the conductive plate 12 may have a keyhole configured to secure the conductive plate 12 with an external substrate. The conductive plate 12 may have a second conductive trace (e.g., a part) 12$t$ disposed around and at the same elevation as the body portion 12$m$ of the conductive plate 12. The part 12$t$ may be spaced part from the body portion 12$m$.

The plurality of electronic components 6 may be disposed between the conductive plate 12 and the conductive plate 13. The plurality of electronic components 6 may be disposed above the conductive plate 12. The plurality of electronic components 6 may be disposed over the body portion 12$m$ of the conductive plate 12 and electrically connect to the part 12$t$ of the conductive plate 12. The electronic device 100 may include a plurality of wirings 6$w$ each connecting one of the electronic components 6 to the second conductive trace 12$t$ of the conductive plate 12. The part 12$t$ of the conductive plate 12 comprises a common electrode electrically connected to a gate terminal of each of the transistors of the electronic components 6. The wirings 6$w$ may include a bond wire or be formed of a wire-bonding apparatus. Each of the electronic components 6 may include a second transistor having a drain terminal connected to the conductive plate 12. In other words, the conductive plate 12 connects the drain terminal of each the electronic components 6. The second transistor of each of the electronic component 6 may have a gate terminal connected to the conductive trace 12$t$ through the wrings 6$w$, and a source terminal connected to the corresponding one of the plurality of connecting portions 5, which may be connected to the conductive plate 13. In other words, the conductive plate 13 connects the source terminal of each the electronic components 6. The second transistor may be an insulated gate bipolar transistor (IGBT) or a power transistor. In some embodiments, the electronic components 6 may be units which are derived or obtained from a wafer or a panel by singulation process. Each of the units 6 may include a semiconductor chip or die.

As shown in FIG. 3, the plurality of electronic components 6 may be arranged along an edge of the body portion 12$m$ of the conductive plate 12. In some embodiments, the conductive plate 12 (or the part 12$m$) may have a first edge 123 and a second edge 124 distinct from the first edge 123. The first edge 123 may be opposite to the second edge 124. The part 12$t$ of the conductive plate 12 may be arranged along the first edge 123 and the second edge 124 of the conductive plate 12. The electronic components 6 include an electronic component 61 arranged at the first edge 123 of the conductive plate 12 and an electronic component 62 arranged at the second edge 124 of the conductive plate 12. The plurality of electronic components 4 may electrically connect to the plurality of electronic components 6 through the conductive plate 12. The conductive plate 12 may be disposed under the electronic components 6 (or electronic components 61 and 62). The conductive plate 13 may be disposed above the electronic components 6 (or electronic components 61 and 62).

The thermistor 9 may be disposed over the conductive plate 12. The thermistor 9 may be in contact with the conductive plate 12. The thermistor 9 may be connected to a part 12$e$ of the conductive plate 12. The thermistor 9 may include a negative temperature coefficient (NTC) thermistor which has less resistance at higher temperatures. The thermistor 9 may include a positive temperature coefficient (PTC) thermistor which has have more resistance at higher temperatures. The thermistor 9 may be configured to detect the temperature of the conductive plate 12, which may represent the temperature of the electronic device 100.

As shown in FIG. 4, the conductive plate 13 may have an end portion 13$k$ exposed by the protective layer 2. The protective layer 2 of the electronic device 100 as illustrated in FIG. 4 may be shown with a dashed line for purposes of explanation. The end portion 13$k$ of the conductive plate 13 may protrude from a body portion thereof. The end portion 13$k$ of the conductive plate 13 may have a keyhole configured to secure the conductive plate 13 with an external substrate.

Referring again to FIG. 1, the protective layer 2 may cover the conductive plate 11, the conductive plate 12, and the conductive plate 13. The protective layer 2 may cover at least one edge of the conductive plate 11. The protective layer 2 may cover at least one edge of the conductive plate 12. The protective layer 2 may cover at least one edge of the conductive plate 13. The protective layer 2 may cover the electronic components 4 (e.g., the electronic component 41 or 42) or the electronic components 6 (e.g., the electronic component 61 or 62). The protective layer 2 may include a first portion 21 and the second portion 22 disposed above the first portion 21. The first portion 21 may be disposed between the conductive plate 11 and the conductive plate 12. The second portion 22 may be disposed between the conductive plate 12 and the conductive plate 13. The first portion 21 may be connected to the second portion 22. The first portion 21 and the second portion 22 may contact each other outside of the at least one edge of the conductive plate 12.

As shown in FIG. 3, the conductive plate 12 may have an opening (or a window element, a through hole) 12$w$. The opening 12$w$ may have sidewalls extending from the surface 121 and the surface 122 of the second conductive plate 2. The protective layer 2 may be at least partially within the through hole 12$w$. The first portion 21 and the second portion 22 may contact each other through an opening. In other words, the first portion 21 and/or the second portion 21 of the protective layer 2 may be partially disposed in the opening 12$w$. The opening 12$w$ may be cross shaped. In other embodiments, the opening 12$w$ may be rectangular, circular, triangular, or of other suitable shapes.

In some embodiments, the protective layer 2 may be formed to cover the conductive plates 11, 12, and 13 by a molding process. In the molding process, a molding material may flow through the window element 12 of the second conductive plate. Owing to the window element 12 providing a path for the molding material, the molding process of the conductive plates 11, 12, and 13 may be complete in a single step (e.g., the transfer molding). Furthermore, the window element 12$w$ may be configured to control or balance the flow of the molding material above or below the conductive plate 12.

In some embodiments, the protective layer 2 may include an encapsulant, such as an epoxy resin, a molding compound (e.g., an epoxy molding compound or other molding compound), a polyimide, a phenolic compound or material, a material including a silicone dispersed therein, or a combination thereof.

As shown in FIG. 1, the plurality of connecting portions 3 may be disposed between the conductive plate 11 and the conductive plate 12. The connecting portions 3 may be included in the conductive plate 12. In some embodiments, the connecting portion 3 and the conductive plate 12 may be formed in one piece. In some embodiments, the connecting portions 3 may each include a spring element. In some embodiments, the connecting portions 3 may each include a clip. The clip of each of the connecting portions 3 may be flexible. The clips may be formed in a stamping of the conductive plate 12. In other words, the clips of the connecting portions 3 and the conductive plate 12 may be formed in one piece.

The connecting portions 3 may include a connecting portion 31 disposed over the electronic component 41 and a connecting portion 32 disposed over the electronic component 42. The electronic component 41 and/or 42 may support the conductive plate 12 through the connecting portion 31 and/or 32. The electronic component 41 may hold the connecting portion (or clip) 31. The electronic component 42 may hold the connecting portion (or clip) 32. The connecting portion 31 may be electrically connected to the electronic component 41. In some embodiments, the electronic component 61 may be configured to electrically connect the electronic component 41 through the connecting portion 31. The connecting portion (or the clip) 31 may connect the drain terminal of the electronic component 61 to the source terminal of the electronic component 41. In some embodiments, the connecting portion 31 may be configured to buffer stress from the conductive plate 12 to the electronic component 41. The connecting portion 32 may be electrically connected to the electronic component 42. In some embodiments, the electronic component 62 may be configured to electrically connect the electronic component 42 through the connecting portion 32. The connecting portion (or the clip) 32 may connect the drain terminal of the electronic component 62 to the source terminal of the electronic component 42. The connecting portion 32 may be configured to buffer stress from the conductive plate 12 to the electronic component 42.

The electronic device 100 may include a solder material 55. The connecting portion 31 may be electrically connected to the electronic component 41 through the solder material 55. The solder material 55 may be wider than the electronic component 41. The electronic device 100 may include a solder material 55'. The connecting portion 32 may be electrically connected to the electronic component 42 through the solder material 55'. The solder material 55' may be wider than the electronic component 42. The electronic components may be electrically connected to the conductive plate 11 through a solder material 57.

Referring to FIG. 3, the connecting portion 31 may be adjacent to the edge 123 and the connecting portion 32 may be adjacent to the edge 124. The connecting portion 31 may be closer to the edge 123 of the conductive plate 12 than the edge 124 thereof. The connecting portion 32 may be closer to the edge 124 of the conductive plate 12 than the edge 123 thereof. The conductive plate 12 may have an opening 12o1. The opening 12o1 may be adjacent to the edge 123 of the conductive plate 12. The connecting portion 31 may extend from the conductive plate 12 to a location under (or an underside of) the opening 12o1. The connecting portion 31 may extend downward from the opening 12o1. The connecting portion 31 may extend below the opening 12o1. The conductive plate 12 may have an opening 12o2. The opening 12o2 may be adjacent to the edge 124 of the conductive plate 12. The connecting portion 32 may extend from the conductive plate 12 to a location under (or an underside of) the opening 12o2. The connecting portion 32 may extend downward from the opening 12o2. The connecting portion 32 may extend below the opening 12o2.

As shown in FIG. 3, the connecting portions 3 may include a connecting portion 33 closer to the edge 123 of the conductive plate 12 than the edge 124 thereof. The connecting portion 33 may be disposed over the electronic device 43. The conductive plate 12 may have an opening 12o3. The opening 12o3 may be adjacent to the edge 123 of the conductive plate 12. The connecting portion 33 may extend from the conductive plate 12 to a location under (or an underside of) the opening 12o3. The connecting portion 33 may extend downward from the opening 12o3. The connecting portion 33 may extend below the opening 12o3. The connecting portions 3 may include a connecting portion 34 closer to the edge 124 of the conductive plate 12 than the edge 123 thereof. The connecting portion 34 may be disposed over the electronic device 44. The conductive plate 12 may have an opening 12o4. The opening 12o4 may be adjacent to the edge 124 of the conductive plate 12. The connecting portion 34 may extend from the conductive plate 12 to a location under (or an underside of) the opening 12o4. The connecting portion 34 may extend downward from the opening 12o3. The connecting portion 34 may extend below the opening 12o4.

In some embodiments, similar to the window element 12w, the opening 12o1, 12o2, 12o3, or 12o4 may provide a path for the molding material, such that the molding process of the conductive plates 11, 12, and 13 may be complete in a single step. Furthermore, the opening 12o1, 12o2, 12o3, or 12o4 may be configured to control or balance the flow of the molding material above or below the conductive plate 12.

The number of the plurality of connecting portions 3 may be 4 (four) as shown in FIG. 3. Alternatively, the number thereof may be varied, for example, 2, 8, or more.

The electronic components 6 may include an electronic component 63 arranged at the first edge 123 of the conductive plate 12. The electronic components 61 and 63 may be disposed side-by-side. The electronic components 6 may include an electronic component 64 arranged at the first edge 124 of the conductive plate 12. The electronic components 62 and 64 may be disposed side-by-side. The connecting portions 31 and 33 may be spaced apart from each other by a portion of the conductive plate 12. The electronic components 61 and 63 may be disposed between the connecting portions 31 and 33. The electronic components 61 and/or 63 may be disposed between the openings 12o1 and 12o3. The connecting portions 32 and 34 may be spaced apart from each other by a portion of the conductive plate 12. The electronic components 62 and/or 64 may be disposed between the connecting portions 32 and 34. The electronic components 62 and 64 may be disposed the openings 12o2 and 12o4.

The number of the plurality of electronic components 6 may be 4 (four) as shown in FIG. 3. Alternatively, the number thereof may be varied, for example, 2, 8, or more.

Referring again to FIG. 1, the connecting portion 31 may have an end (or section) 312 connected to the conductive plate 12, and an end (or section) 311 connected to the electronic component 41. The end 311 may extend substantially parallel to the surface 112 of the conductive plate 11. The end 312 may extend between the end 311 and the surface 121 of the conductive plate 12. A junction of the end 312 of the connecting portion 31 and the conductive plate 12 and a junction of the end 311 of the connecting portion 31 and the electronic component 41 may at least not overlap perpendicular to the surface 121 of the conductive plate 12. In some embodiments, the end 311 may be partially non-overlapping with the end 312 from a cross-sectional view, as shown in FIG. 1. The end 312 of the connecting portion 31 and the surface 121 of the conductive plate 12 define a space SP1. The end 312 and the end 311 of the connecting portion 31 may form an oblique angle $\alpha1$. The section 312 of the connecting portion 31 may be non-perpendicular to the electronic component 41. The connecting portion 31 may have an oblique surface 3122 with respect to the conductive plate 12.

In some embodiments, the connecting portion 32 may have an end 322 connected to the conductive plate 12, and an end 321 connected to the electronic component 42. The end 321 may extend substantially parallel to the surface 112 of the conductive plate 11. The end 322 may extend between the end 321 and the surface 121 of the conductive plate 12. A junction of the end 322 of the connecting portion 32 and the conductive plate 12 and a junction of the end 321 of the connecting portion 32 and the electronic component 42 may be at least non-overlapping with each other perpendicular to the surface 121 of the conductive plate 12. In some embodiments, the end 321 may be partially non-overlapping with the end 322 from a cross-sectional view, as shown in FIG. 1. The end 322 of the connecting portion 32 and the surface 121 of the conductive plate 12 define a space SP2. The end 322 and the end 321 of the connecting portion 32 may form an oblique angle $\alpha2$. The section 322 of the connecting portion 32 may be non-perpendicular to the electronic component 42. The connecting portion 32 may have an oblique surface 3222 with respect to the conductive plate 12. The oblique angle $\alpha1$ and the oblique angle $\alpha2$ may be substantially the same. In some embodiments, the oblique angle α1 and the oblique angle α2 may be different.

As shown in FIG. 1, the plurality of connecting portions 5 may be disposed between the conductive plate 12 and the conductive plate 13. The connecting portions 5 may be included in the conductive plate 13. In some embodiments, the connecting portion 5 and the conductive plate 13 may be formed in one piece. In some embodiments, the connecting portions 5 may each include a spring element. In some embodiments, the connecting portions 5 may each include a clip. The clip of each of the connecting portions 5 may be flexible. The clips may be formed in a stamping of the conductive plate 13. In other words, the clips of the connecting portions 5 and the conductive plate 13 may be formed in one piece.

The connecting portions 5 may include a connecting portion 51 disposed over the electronic component 61 and a connecting portion 52 disposed over the electronic component 62. The electronic component 61 and/or 62 may support the conductive plate 13 through the connecting portion 51 and/or 52. The electronic component 61 may hold the connecting portion (or clip) 51. The electronic component 62 may hold the connecting portion (or clip) 52. The connecting portion 51 may be electrically connected to the electronic component 61 and configured to buffer stress from the conductive plate 13 to the electronic component 51. The connecting portion 52 may be electrically connected to the electronic component 62 and configured to buffer stress from the conductive plate 13 to the electronic component 52. In some embodiments, the connecting portion (or the clip) 31 may be configured to buffer stress from the conductive plate 13 to the electronic component 61. In some embodiments, the connecting portion (or the clip) 32 may be configured to buffer stress from the conductive plate 13 to the electronic component 62.

In some embodiments, the connecting portion (or the clip) 31 and the connecting portion (or the clip) 51 may be configured to buffer stress from the conductive plate 13 to the electronic component 41. In some embodiments, the connecting portion (or the clip) 32 and the connecting portion (or the clip) 52 may be configured to buffer stress from the conductive plate 13 to the electronic component 42. In some embodiments, the connecting portions 3 and the connecting portions 5 may be configured to collaboratively buffer stress from the conductive plate 13 to the electronic components 4 and/or 6.

The electronic device 100 may include a solder material 56. The connecting portion 51 may be electrically connected to the electronic component 61 through the solder material 56. The solder material 56 may be wider than the electronic component 61. The electronic device 100 may include a solder material 56'. The connecting portion 52 may be electrically connected to the electronic component 62 through the solder material 56'. The solder material 56' may be wider than the electronic component 62. The electronic components may be electrically connected to the conductive plate 11 through a solder material 58.

Referring to FIG. 4, the conductive plate 13 may have an edge 133 distinct from the edge 134. The edge 133 may be opposite to the edge 134. The connecting portion 51 may be adjacent to the edge 133 and the connecting portion 52 may be adjacent to the edge 134. The connecting portion 51 may be closer to the edge 133 of the conductive plate 13 than the edge 134 thereof. The connecting portion 52 may be closer to the edge 134 of the conductive plate 13 than the edge 133 thereof. The conductive plate 13 may have an opening 13o1. The opening 13o1 may be adjacent to the edge 133 of the conductive plate 13. The connecting portion 51 may extend from the conductive plate 13 to a location under (or an underside of) the opening 13o1. The connecting portion 51 may extend below the opening 13o1. The conductive plate 13 may have an opening 13o2. The opening 13o2 may be adjacent to the edge 134 of the conductive plate 13. The connecting portion 52 may extend from the conductive plate 13 to a location under (or an underside of) the opening 13o2. The connecting portion 52 may extend below the opening 13o2.

As shown in FIG. 4, the connecting portions 5 may include a connecting portion 53 closer to the edge 133 of the conductive plate 12 than the edge 134 thereof. The connecting portion 53 may be disposed over the electronic device 63. The electronic components 61 and 63 may be disposed below the openings 13o1. The connecting portion 53 may extend from the conductive plate 12 to a location under (or an underside of) the opening 1301. The connecting portion 53 may extend below the opening 13o1. The connecting portions 5 may include a connecting portion 54 closer to the edge 134 of the conductive plate 13 than the edge 133 thereof. The connecting portion 54 may be disposed over the electronic device 64. The electronic components 62 and 64 may be disposed below the openings 13o2. The connecting portion 54 may extend from the conductive plate 13 to a location under (or an underside of) the opening 13o2. The connecting portion 54 may extend below the opening 13o2.

The number of the plurality of connecting portions 5 may be 4 (four) as shown in FIG. 4. Alternatively, the number thereof may be varied, for example, 2, 8, or more.

Referring again to FIG. 1, the connecting portion 51 may have an end (or section) 512 connected to the conductive plate 13, and an end (or section) 511 connected to the electronic component 61. The end 511 may extend substantially parallel to the surface 122 of the conductive plate 12. The end 512 may extend between the end 511 and the surface 131 of the conductive plate 13. A junction of the end 512 of the connecting portion 51 and the conductive plate 13 and a junction of the end 511 of the connecting portion 51 and the electronic component 61 may be at least non-overlapping with each other perpendicular to the surface 131 of the conductive plate 13. In some embodiments, the end 511 may be partially non-overlapping with the end 512 from a cross-sectional view, as shown in FIG. 1. The end 512 of the connecting portion 51 and the surface 121 of the conductive plate 13 define a space SP3. The end 512 and the end 511 of the connecting portion 51 may form an oblique angle α3. The section 512 of the connecting portion 51 may be non-perpendicular to the electronic component 61. The connecting portion 51 may have an oblique surface 5122 with respect to the conductive plate 13.

In some embodiments, the connecting portion 52 may have an end 522 connected to the conductive plate 13, and an end 521 connected to the electronic component 62. The end 521 may extend substantially parallel to the surface 122 of the conductive plate 12. The end 522 may extend between the end 521 and the surface 121 of the conductive plate 13. A junction of the end 522 of the connecting portion 52 and the conductive plate 13 and a junction of the end 521 of the connecting portion 52 and the electronic component 62 may be at least non-overlapping with each other perpendicular to the surface 131 of the conductive plate 13. In some embodiments, the end 521 may be partially non-overlapping with the end 522 from a cross-sectional view, as shown in FIG. 1. The end 522 of the connecting portion 52 and the surface 131 of the conductive plate 13 define a space SP4. The end 522 and the end 521 of the connecting portion 52 may form an oblique angle $\alpha 4$. The section 522 of the connecting portion 52 may be non-perpendicular to the electronic component 62. The connecting portion 52 may have an oblique surface 5222 with respect to the conductive plate 13. The oblique angle $\alpha 3$ and the oblique angle $\alpha 4$ may be substantially the same. In some embodiments, the oblique angle $\alpha 3$ and the oblique angle $\alpha 4$ may be different.

In some comparative embodiments, the conductive plates may be connected by a plurality of spacers (formed by surface mount technology, SMT) through solder materials. During the formation of the protective layer 2, a mold (or a head of a tool) can apply force to the top conductive plate such that the spacers compress the underlying electronic components. The characteristics of the electronic components may be deteriorated. In the present disclosure, the connecting portions 3 may be configured to deform to relieve the stress from the conductive plate 12 to the electronic components 4, for example, during the process of forming the protective layer 2 by molding. The connecting portions 5 may be configured to deform to relieve the stress from the conductive plate 13 to the electronic components 6, for example, during the process of forming the protective layer 2 by molding. The connecting portions 3 buffer the stress and thus the characteristics of the electronic components 4 are protected from the stress, improving yield. Similarly, the connecting portions 5 buffer the stress and thus the characteristics of the electronic components 6 may be intact from the stress, improving yield.

Furthermore, the electronic device 100 with the connecting portions (e.g., 3 and 5) reduces solder required by at least one compared with the spacers. Deviation during the manufacture of the electronic device 100 may be reduced. The effective resistance between the conductive plates and the electronic components may be reduced compared to SMT spacers which require at least two solders for the attachment.

The flexibility of the clips of the connecting portions 3 and 5 may alleviate the impact from deviations cumulated during the manufacture of the electronic device 100, such as the deviations of the size (or the length) between the connecting portions 3 (or the connecting portions 5), the thickness between the solder materials 55, 55', 56, 57, 57', and 58, and/or the thickness between the electronic components 4 (or the electronic components 6). For example, if there are deviations among the length of the connecting portions 3, the longer end (e.g., the end 312 or 322) of one of the connection portions 3 may be more oblique than the end of another connecting portion. In other words, the clips of the connecting portions 3 may deform to compensate the deviations thereof at the same elevation, such that the height along a Z-axis may substantially be the same and the upper conductive plate (e.g., the conductive plate 12) is angled only slightly or not at all. Size tolerance of the electronic device 100 can be controlled within a relatively minimal tolerance.

Figure 5:
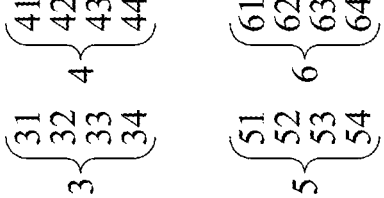
FIG. 5 is a perspective view of an exemplary electronic device according to some embodiments of the present disclosure.

FIG. 5 is a perspective top view of the electronic device 100 according to some embodiments of the present disclosure. As shown in FIG. 5, the conductive plate 11, the conductive plate 12, and the conductive plate 13 are stacked. Different conductive plates are shown differently (e.g., the conductive plate 11 in solid line, the conductive plate 12 in chain line, and the conductive plate 13 in dashed line) for clarity. As shown in FIG. 5, the opening 12$o$1 and/or the opening 12$o$3 of the conductive plate 12 may misalign with the opening 13$o$1 of the conductive plate 13 from a top view perspective. The opening 12$o$2 and/or the opening 12$o$4 of the conductive plate 12 may misalign with the opening 13$o$2 of the conductive plate 13 from a top view.

In some embodiments, the connecting portion (or the clip) 31 of the conductive plate 12 and the connecting portion (or the clip) 51 of the conductive plate 13 may be dislocated from a top view. The connecting portion (or the clip) 32 of the conductive plate 12 and the connecting portion (or the clip) 52 of the conductive plate 13 may be arranged in a dislocated manner from a top view. The connecting portion (or the clip) 33 of the conductive plate 12 and the connecting portion (or the clip) 53 of the conductive plate 13 may be arranged in a dislocated manner from a top view. The connecting portion (or the clip) 34 of the conductive plate 12 and the connecting portion (or the clip) 54 of the conductive plate 13 may be arranged in a dislocated manner from a top view.

In some embodiments, the connecting portion (or the clip) 31 of the conductive plate 12 may be at least partially non-overlapping with the connecting portion (or the clip) 51 of the conductive plate 13 from a top view. In some embodiments, the connecting portion (or the clip) 32 of the conductive plate 12 may be at least partially non-overlapping with the connecting portion (or the clip) 52 of the conductive plate 13 from a top view. In some embodiments, the connecting portion (or the clip) 33 of the conductive plate 12 may be at least partially non-overlapping with the connecting portion (or the clip) 53 of the conductive plate 13 from a top view. In some embodiments, the connecting portion (or the clip) 34 of the conductive plate 12 may be at least partially non-overlapping with the connecting portion (or the clip) 54 of the conductive plate 13 from a top view.

In some embodiments, the electronic component 41 and the electronic component 61 may be arranged in a dislocated manner from a top view. The electronic component 42 and the electronic component 62 may be arranged in a dislocated manner from a top view. The electronic component 43 and the electronic component 63 may be arranged in a dislocated manner from a top view. The electronic component 44 and the electronic component 64 may be arranged in a dislocated manner from a top view.

The second heat dissipation structure 7 may be disposed below the electronic components 4. The first heat dissipation structure 7 may be disposed on the surface 111 of the conductive plate 11. The first heat dissipation structure 7 may be in contact with the conductive plate 11. The first heat dissipation structure 7 may be connected to the surface 111 of the conductive plate 11 through an adhesion layer (not shown), such as a heat dissipation gel. The surface 111 of the conductive plate 11 may include a heat sink, such as heat dissipation fins, a cooling channel, or a heat dissipation plate. In some embodiments, the first heat dissipation structure 7 may be connected to an external liquid cooling system (e.g., a liquid cooling pipeline of an automobile) to dissipate the heat from the electronic device 100. The first heat dissipation structure 7 may be configured to dissipate the heat from the electronic device 100 to an external environment. The first heat dissipation structure 7 may be configured to dissipate the heat from the conductive plate 12, the plurality of connecting portions 3, the plurality of electronic components 4, and/or the conductive plate 11 to an external environment. In some embodiments, the conductive plate 11 may be configured to transfer heat from the electronic components 4 to the first heat dissipation structure 7. The second heat dissipation structure 7 may be configured to dissipate heat from one or more of the electronic components 4.

The second heat dissipation structure 8 may be disposed above the electronic components 6. The second heat dissipation structure 8 may be disposed on the surface 132 of the conductive plate 13. The second heat dissipation structure 8 may be in contact with the conductive plate 13. The second heat dissipation structure 8 may be connected to the surface 132 of the conductive plate 13 through an adhesion layer (not shown), such as a heat dissipation gel. The surface 132 of the conductive plate 13 may include a heat sink, such as heat dissipation fins, a cooling channel, or a heat dissipation plate. In some embodiments, the second heat dissipation structure 8 may be connected to an external liquid cooling system (e.g., a liquid cooling pipeline of an automobile) to dissipate the heat from the electronic device 100. The second heat dissipation structure 8 may be configured to dissipate the heat of the electronic device 100 to an external environment. The second heat dissipation structure 8 may be configured to dissipate the heat from the conductive plate 12, the plurality of connecting portions 5, the plurality of electronic devices 6, and the conductive plate 13 to an external environment. The conductive plate 13 may be configured to transfer a heat from the electronic components 6 to the second heat dissipation structure 8. The second heat dissipation structure 8 may be configured to dissipate heat from one or more of the electronic components 6.

A first heat dissipation path T1 may be established by heat absorption of the first heat dissipation structure 7. The first heat dissipation structure 7 may be configured to provide the first heat dissipation path T1 for the electronic component 4. Heat generated from the connecting portions 3 and the electronic components 4 may be transferred to the first heat dissipation structure 7 along the first heat dissipation path T1. Heat generated by the connecting portions 5 and the electronic components 6 may be transferred to the first heat dissipation 7 along the first heat dissipation path T1. A second heat dissipation path T2 may be established by heat absorption of the second heat dissipation structure 8. The second heat dissipation structure 8 may be configured to provide a second heat dissipation path T2 for the electronic component 6. Heat generated by the connecting portions 5 and the electronic components 6 may be transferred to the second heat dissipation 8 along the second heat dissipation path T2. Heat generated by the connecting portions 3 and the electronic components 4 may be transferred to the second heat dissipation 8 along the second heat dissipation path T2. That is, the first heat dissipation structure 7 may be used to dissipate heat generated by the connecting portions 3 and the electronic components 4 and the heat generated by the connecting portions 5 and the electronic components 6, and the second heat dissipation structure 8 may be used to dissipate heat generated by the connecting portions 3 and the electronic components 4 and the heat generated by the connecting portions 5 and the electronic components 6. None of the connecting portions 3 overlap the connecting portions 5 perpendicular to the surface 111 of the conductive plate 11 or from a top view. The dislocation relationship of the plurality of connecting portions 3 and the plurality of connecting portions 5 may prevent the heat generated by the connecting portions 3 and the electronic components 4 and the heat generated by the connecting portions 5 and the electronic components 6 from accumulating and thus enable more efficient heat dissipation. Therefore, the heat dissipation of the electronic device 100 can be improved and any heat buildup avoided.

In some comparative embodiments, the electronic components of an electronic device may be arranged at the same elevation, which may hinder size reduction efforts for the electronic device. In the present disclosure, the electronic device 100 includes the electronic components 4 and the electronic components 6 stacked on the electronic components 4 to reduce the size of the structure. The power dissipation path (or the power transmission path) can be shorter and power loss reduced. Furthermore, the plurality of the electronic components 4 and the plurality of the electronic components 6 are disposed on different surfaces of the conductive plate 12 (e.g., the surface 121 and the surface 122). The conductive plate 12 is configured as the drain terminal of the plurality of the electronic components 6 and the source terminal of the plurality of the electronic components 4. As such, the overall power density of the electronic device 100 can be increased while the form factor of the power module is minimized, providing power exceeding 850 W, which can be used to provide power to automobile motors.

Figure 6:
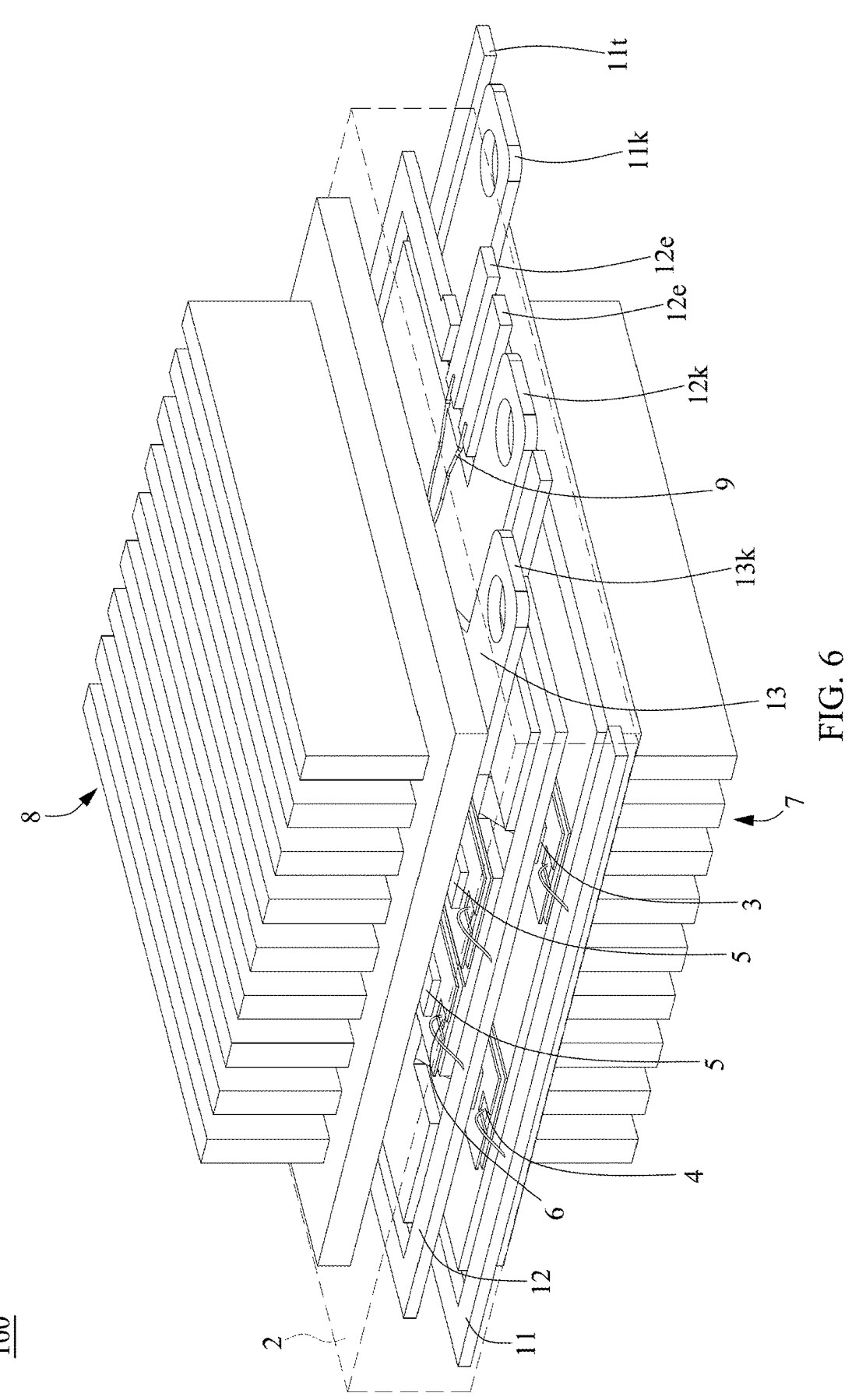
FIG. 6 is a 3D view of an exemplary electronic device according to some embodiments of the present disclosure.

FIG. 6 is a three dimensional (3D) view of an exemplary electronic device (e.g., the electronic device 100) according to some embodiments of the present disclosure. The protective layer 2 of the electronic device 100 as illustrated in FIG. 6 may be shown with a dashed line for purposes of explanation. As shown in FIG. 6, the conductive plate 12 may be spaced apart from the conductive plate 11 by the connecting portions 3. The conductive plate 12 may be spaced apart from the conductive plate 13 by the connecting portions 5. The first heat dissipation structure 7 may have a fin structure to increase the surface area of the first heat dissipation structure 7. The first heat dissipation structure 8 may have a fin structure to increase the surface area of the first heat dissipation structure 8.

As shown in FIG. 6, the end portion 11k of the conductive plate 11 may be exposed by the protective layer 2. The first conductive trace 11t may be exposed by the protective layer 2. In other words, the conductive plate 11 may include a plurality of end portions (e.g., the end portion 11k and an end portion of the first conductive trace 110 exposed by the protective layer 2, wherein the end portions have different electrical potential. The end portion Ilk of the conductive plate 11 and the first conductive trace 11t may be disposed at the same elevation. The end portion 12k of the conductive plate 12 may be exposed by the protective layer 2. The second conductive trace 12t may be exposed by the protective layer 2. In other words, the conductive plate 12 may include a plurality of end portions (e.g., the end portion 12k and an end portion of the first conductive trace 12t) exposed by the protective layer 2, wherein the end portions have different electrical potential. The end portion 12k of the conductive plate 12 and the second conductive trace 12t may be disposed at the same elevation. The end portion 13k of the conductive plate 13 may be exposed by the protective layer 2. The protective layer 2 may be cuboid, cylindrical, or the like.

Figure 7:
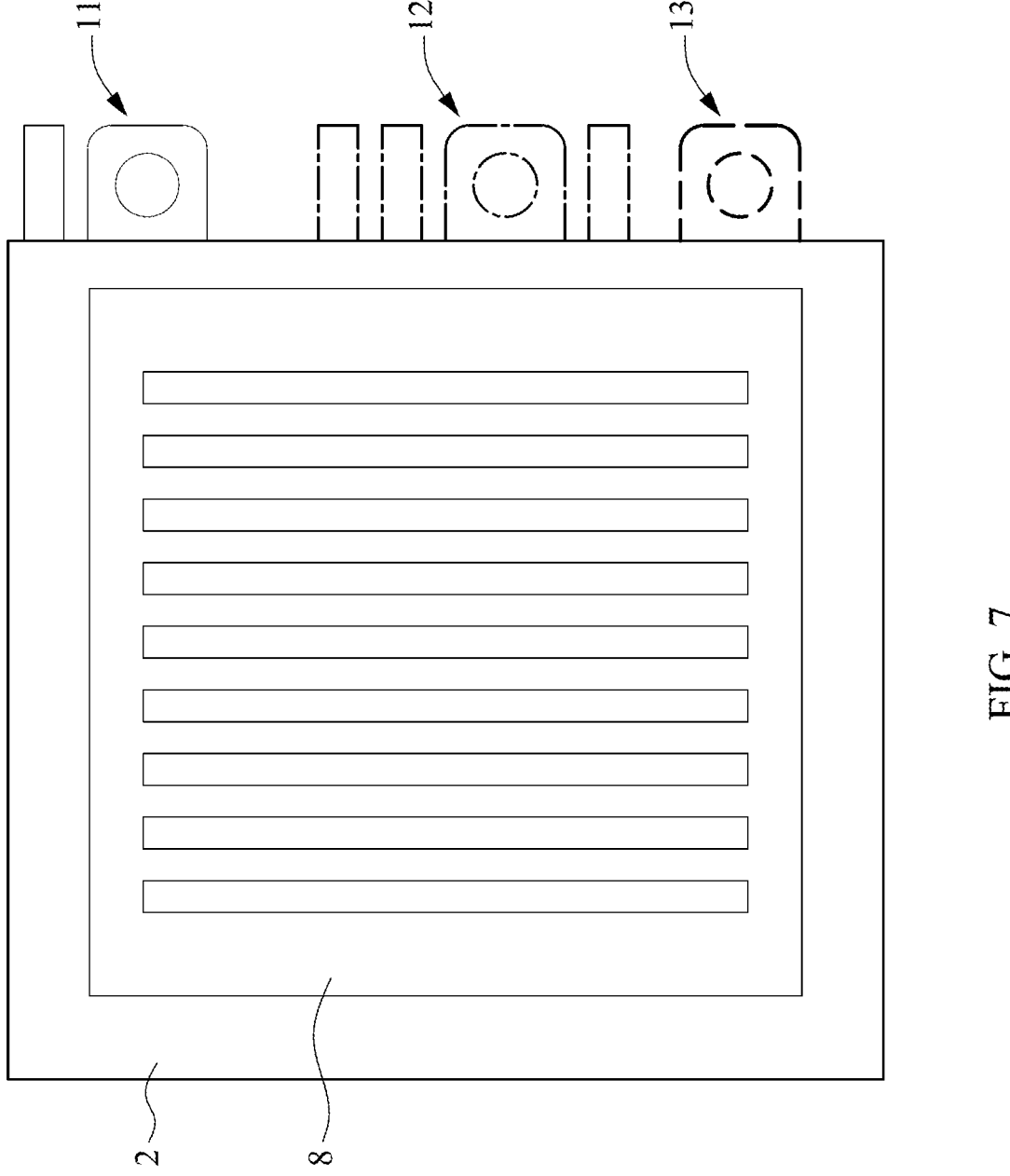
FIG. 7 is a top view of an exemplary electronic device according to some embodiments of the present disclosure.

FIG. 7 is a top view of an exemplary electronic device (e.g., the electronic device 100) according to some embodiments of the present disclosure. The heat dissipation structure 8 is narrower than the protective layer 2. The end portions 11k, 12k, and 13k may be protruded from the same edge of the protective layer 2.

Figure 8:
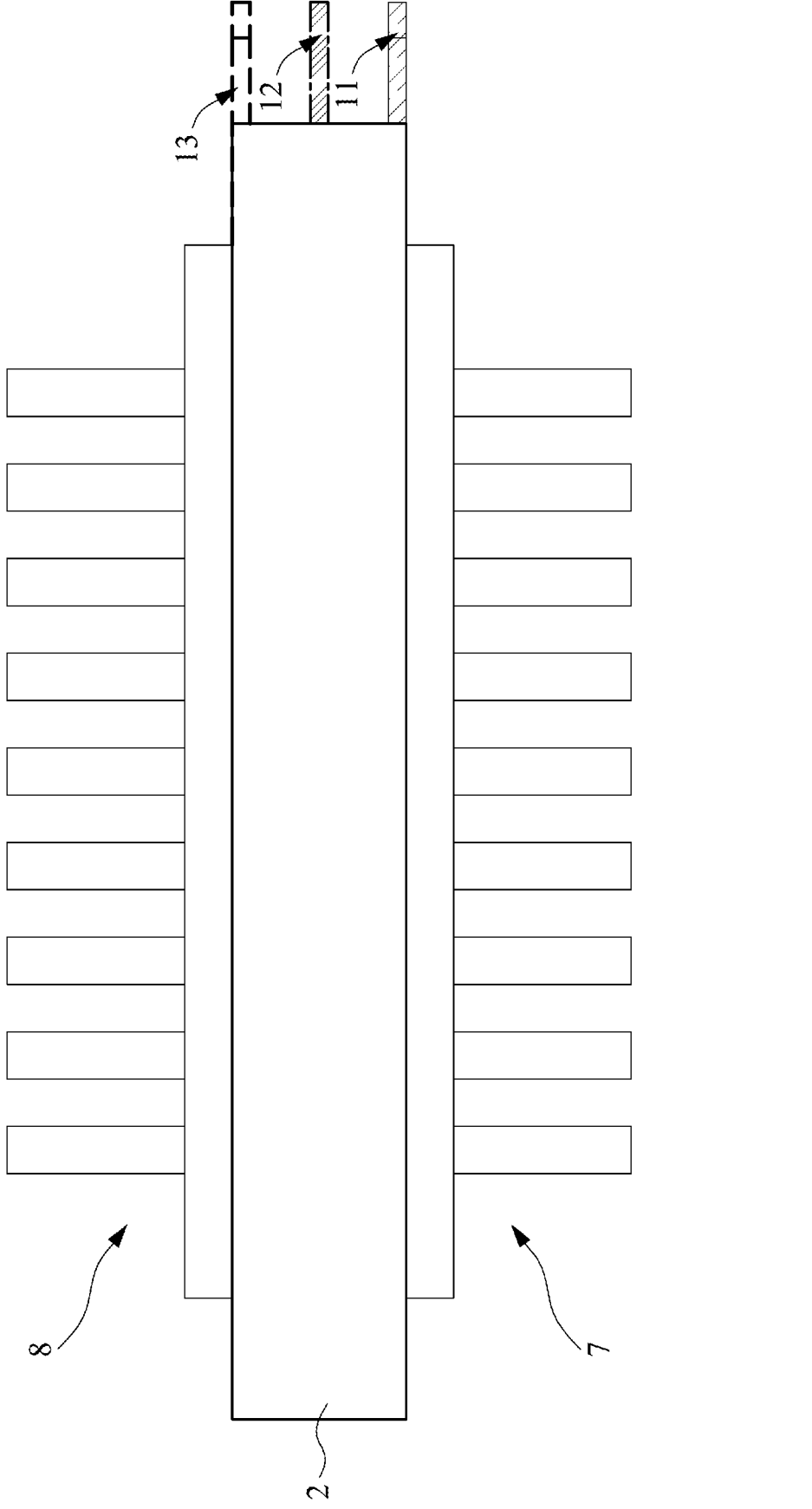
FIG. 8 is a side view of an exemplary electronic device according to some embodiments of the present disclosure.
Figure 9:
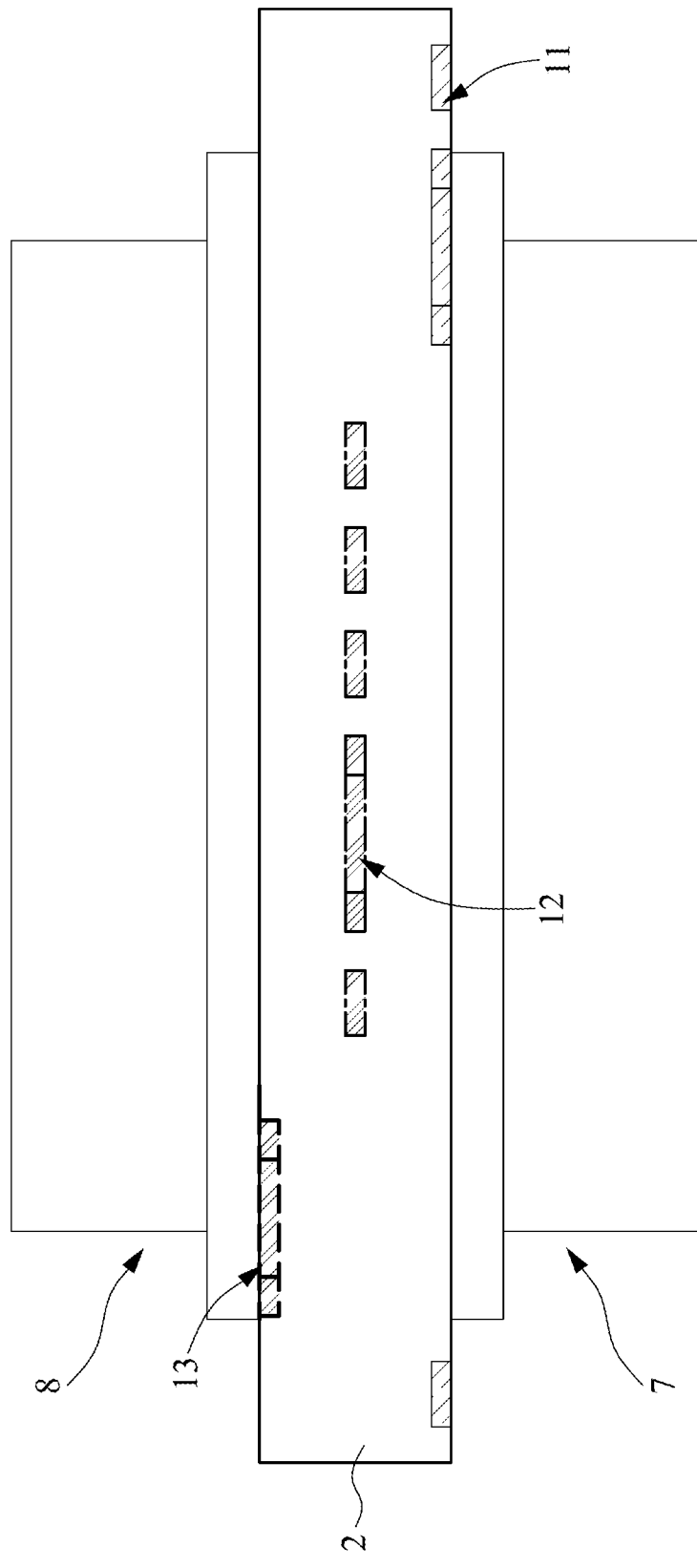
FIG. 9 is a side view of an exemplary electronic device according to some embodiments of the present disclosure.

FIG. 8 is a side view of an exemplary electronic device (e.g., the electronic device 100) according to some embodiments of the present disclosure. FIG. 9 is a side view of an exemplary electronic device (e.g., the electronic device 100) according to some embodiments of the present disclosure. The protective layer 2 may cover the conductive plates 11, 12, and 13, except for the end portions 11k, 12k, and 13k.

Figure 10A:
FIG. 10A is a top view of an exemplary first conductive plate of an electronic device according to some embodiments of the present disclosure.

FIG. 10A is a top view of an example of the conductive plate 11 of the electronic device 100 according to some embodiments of the present disclosure. As shown in FIG. 10A, a length from an end of the first conductive trace 11t adjacent to the end portion Ilk of the conductive plate 11 to an end of the first conductive trace 11t distant from the end portion 11k of the conductive plate 11 is denoted as "L11." The length "L11" may be around 52 mm. A length of the conductive plate 11 is denoted as "L12." The length "L12" may be around 44 mm. A length of the electronic component 4 is denoted as "L13." The length "L13" may be around 7 mm. A diameter of the key hole of the end portion 11k may be denoted as "D11." The diameter "D11" may be around 4 mm. A width from an end of the conductive trace 11t adjacent to the end portion 11k of the conductive plate 11 to an end of the first conductive trace 11t distant from the end portion 11k of the conductive plate 11 is denoted as "W11." The width "W11" may be around 61 mm. A width of the conductive plate 11 is denoted as "W12." The width "W12" may be around 40 mm. A distance between the centers of the electronic components perpendicular to the length "W12" may be denoted as "D12." The distance "D12" may be around 21 mm. A distance of a center of the keyhole of the end portion Ilk of the conductive plate 11 and a center of the conductive plate 11 along the width "W11" thereof is denoted as "X11." The distance "X11" may be around 29 mm. A distance of the center of the keyhole of the end portion 11k of the conductive plate 11 and the center of the conductive plate 11 along the length "L12" thereof is denoted as "Y11." The distance "Y11" may be around 18 mm. A distance of an end of the first conductive trace 11t distance from the end portion 11k and the center of the conductive plate 11 along the length "L12" thereof is denoted as "Y12." The distance "Y11" may be around 26 mm.

Figure 10B:
FIG. 10B is a cross-section of an exemplary conductive plate of an electronic device according to some embodiments of the present disclosure.
Figure 10B:
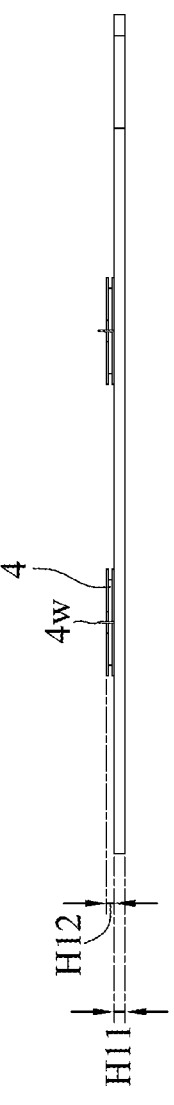
Figure 10B:

FIG. 10B is a cross-section of the conductive plate 11 of the electronic device 100 according to some embodiments of the present disclosure. The conductive plate 11 has a height H11. The height H11 may be around 1 mm. The electronic components 4 may each have a height H12. The height H2 may be around 0.4 mm.

Figure 11A:
FIG. 11A is a top view of an exemplary conductive plate of an electronic device according to some embodiments of the present disclosure.

FIG. 11A is a top view of an example of the conductive plate 12 of the electronic device 100 according to some embodiments of the present disclosure. As shown in FIG. 11A, a length from an end of the second conductive trace 12t adjacent to the end portion 12k of the conductive plate 12 to an end of the second conductive trace 12t distant from the end portion 12k of the conductive plate 12 is denoted as "L21." The length "L21" may be around 47 mm. A length of the conductive plate 12 is denoted as "L22." The length "L22" may be around 39 mm. A length of the electronic component 4 is denoted as "L23." The length "L23" may be around 7 mm. A diameter of the key hole of the end portion 12k may be denoted as "D13." The diameter "D13" may be around 4 mm. A width from an end of the second conductive trace 12t adjacent to the end portion 12k of the conductive plate 12 to an end of the second conductive trace 12t distant from the end portion 12k of the conductive plate 12 is denoted as "W21." The width "W21" may be around 43 mm. A width of the conductive plate 12 is denoted as "W22." The width "W22" may be around 35 mm. A width of the second conductive trace 12t may be denoted as "W23." The width "W23" may be around 2 mm. A distance between the centers of the electronic components 5 perpendicular to the length "W22" may be denoted as "D22." The distance "D22" may be around 9 mm. A distance of a center of the keyhole of the end portion 12k of the conductive plate 12 and a center of the conductive plate 12 along the width "W22" thereof is denoted as "X21." The distance "X21" may be around 29 mm. A distance of the center of the keyhole of the end portion 12k of the conductive plate 12 and the center of the conductive plate 12 along the length "L22" thereof is denoted as "Y21." The distance "Y21" may be around 1 mm.

The opening 12w of the conductive plate 12 may have a diameter denoted as "R1" and "R2" and a gap at the center thereof denoted as "G1" and "G2." The diameter "R1" and "R2" may be around 16 mm. The width/length of the gap "G1" and "G2" may be around 2 mm. A space between two the parts 12e of the conductive plate 12 is denoted as "S1." The space "51" may be around 2 mm.

Figure 11B:
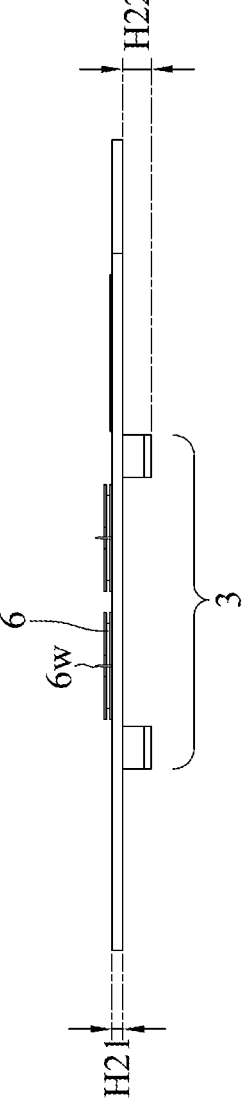
FIG. 11B is a cross-section of an exemplary conductive plate of an electronic device according to some embodiments of the present disclosure.
Figure 11B:

FIG. 11B is a cross-section of the conductive plate 12 of the electronic device 100 according to some embodiments of the present disclosure. The conductive plate 12 has a height H21. The height H21 may be around 1 mm. The connecting portions 3 may each have a height H22. The height H22 may be around 2 mm.

Figure 12A:
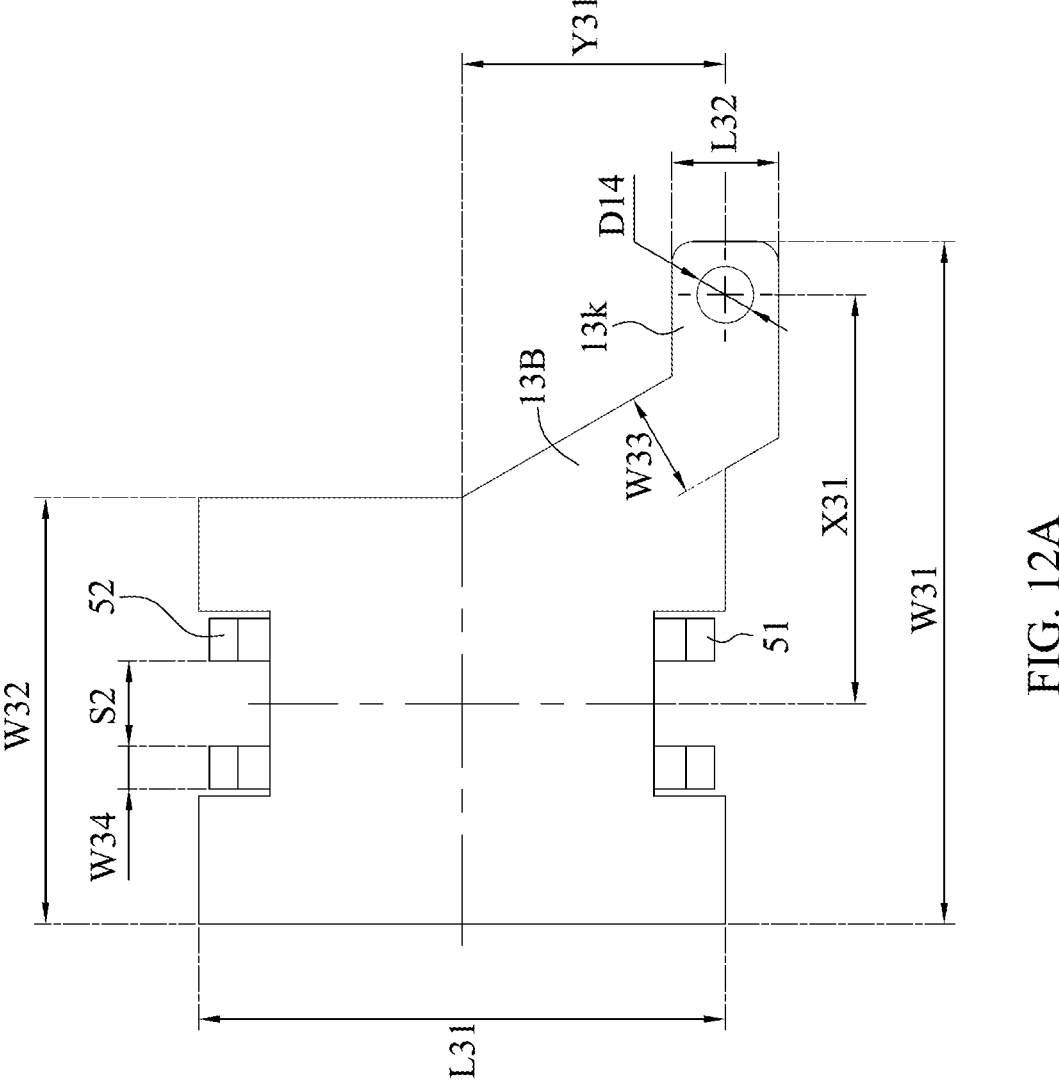
FIG. 12A is a top view of an exemplary conductive plate of an electronic device according to some embodiments of the present disclosure.
Figure 12A:

FIG. 12A is a top view of an example of the conductive plate 13 of the power module 100 according to some embodiments of the present disclosure. As shown in FIG. 12A, a length of the conductive plate 13 is denoted as "L31." The length "L31" may be around 34 mm. A length of the terminal portion 13k is denoted as "L32." The length "L32" may be around 8 mm. A diameter of the key hole of the terminal portion 13k may be denoted as "D14." The diameter "D14" may be around 4 mm. A width of the terminal portion 13k and an edge of the conductive plate 13 are denoted as "W31." The width "W31" may be around 48 mm. A width of the conductive plate 11 is denoted as "W32." The width "W32" may be around 30 mm. A width of a bridge portion 13B connecting a main part of the conductive plate 13 and the terminal portion 13k may be denoted as "W33." The width "W33" may be around 8 mm. A width of the connecting portions 5 may be denoted as "W34." The width "W34" may be around 3 mm. A distance of a center of the keyhole of the end portion 13k of the conductive plate 13 and a center of the conductive plate 13 along the width "W31" thereof is denoted as "X31." The distance "X11" may be around 29 mm. A distance of the center of the keyhole of the end portion 13k of the conductive plate 13 and the center of the conductive plate 13 along the length "L31" thereof is denoted as "Y31." The distance "Y31" may be around 18 mm. A space between the connecting portions 5 may be denoted as "S2." The space "S2" may be around 6 mm.

Figure 12B:
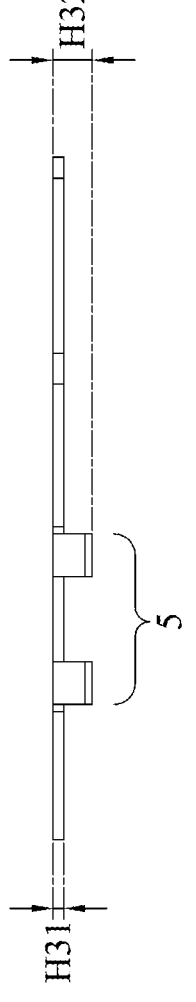
FIG. 12B is a cross-section of an exemplary conductive plate of an electronic device according to some embodiments of the present disclosure.
Figure 12B:

FIG. 12B is a cross-section of the conductive plate 13 of the electronic device 100 according to some embodiments of the present disclosure. The conductive plate 13 has a height H31. The height H31 may be around 1 mm. The connecting portions 5 may each have a height H32. The height H32 may be around 2 mm.

Figure 13:
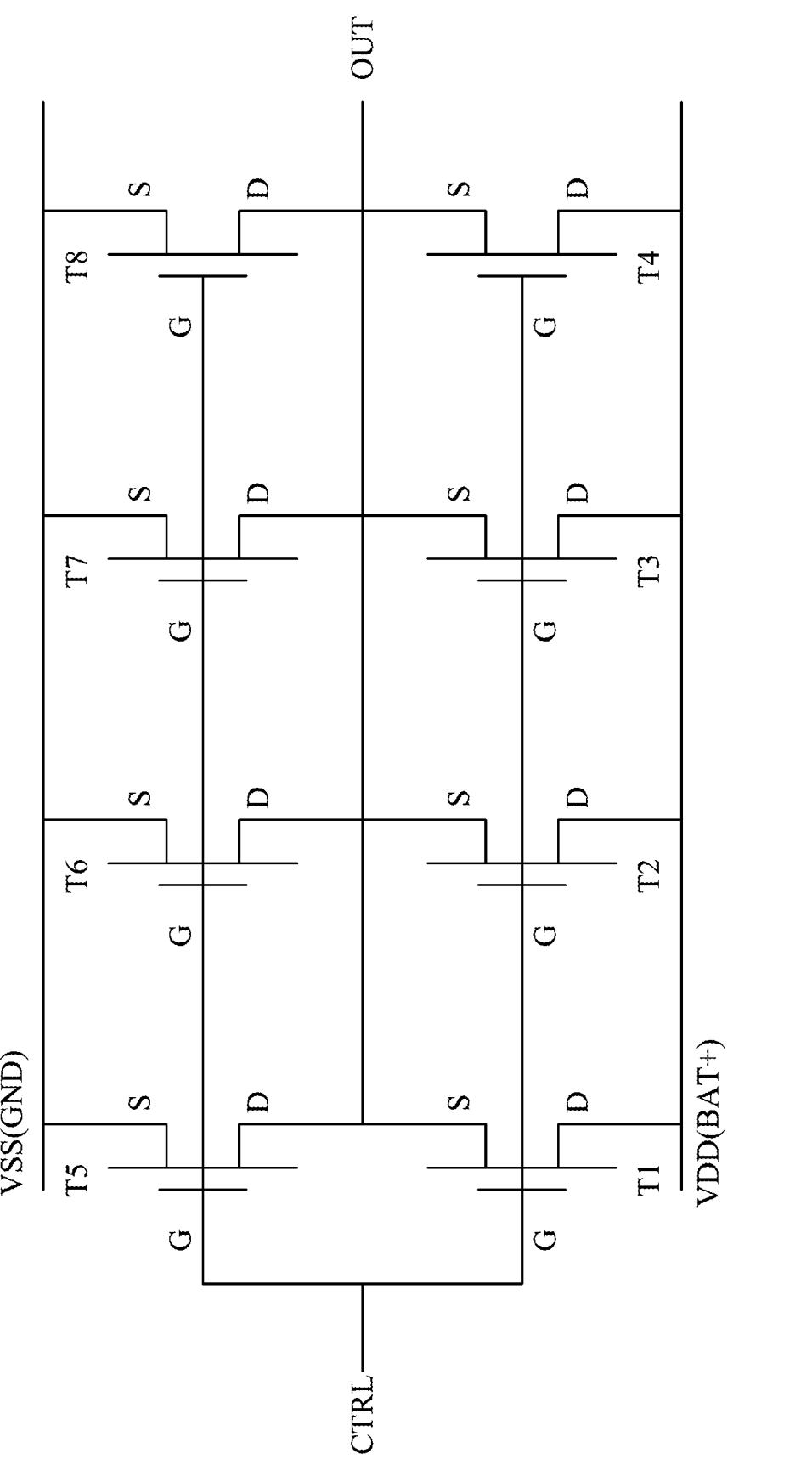
FIG. 13 is a circuit diagram of an exemplary power module according to some embodiments of the present disclosure.

FIG. 13 is a circuit diagram of an exemplary power module packaging structure (the power module 100) according to some embodiments of the present disclosure. The power module 100 may include transistors T1, T2, T3, T4, T5, T6, T7, and T8. The transistor T1 may be one of the electronic components 4. The transistor T1 may have a drain terminal D connected to a voltage supply VDD (BAT+, i.e., a battery), a gate terminal G configured to receive a control signal CTRL, a source terminal S connected to an output OUT. The transistor T5 may be one of the electronic components 6. The transistor T5 may have a drain terminal D connected to the output OUT and the source terminal S of the transistor T1, a source terminal connected to a voltage supply VSS (GND, i.e., a ground potential) and a gate terminal configured to receive the control signal CTRL. Each of the transistors T6, T7, T8 may be one of the electronic components 4. The transistors T6, T7, and T8 may be similar to the transistor T5. The electronic component 6 may include set of transistors T5 to T8 and the electronic component 4 may include a set of transistors T1 to T4, wherein the conductive plate 12 as illustrated in FIG. 1 may be configured as a drain terminal of the set of transistors T5 to T8 and a source terminal of the set of transistors T1 to T4. The conductive plate 11 may be configured as a drain terminal of the transistors T1 to T4 of the electronic component 4. The conductive plate 13 may be configured as a source terminal of the transistors T5 to T8 of the electronic component 6.

The transistors T1, T2, T3, and T4 may be connected in parallel to provide relatively high current. The transistors T1, T2, T3, and T4 may form a high side power switch. The transistors T5, T6, T7, and T8 may be connected in parallel to provide relatively high current. The transistors T5, T6, T7, and T8 may form a low side power switch.

Figure 14:
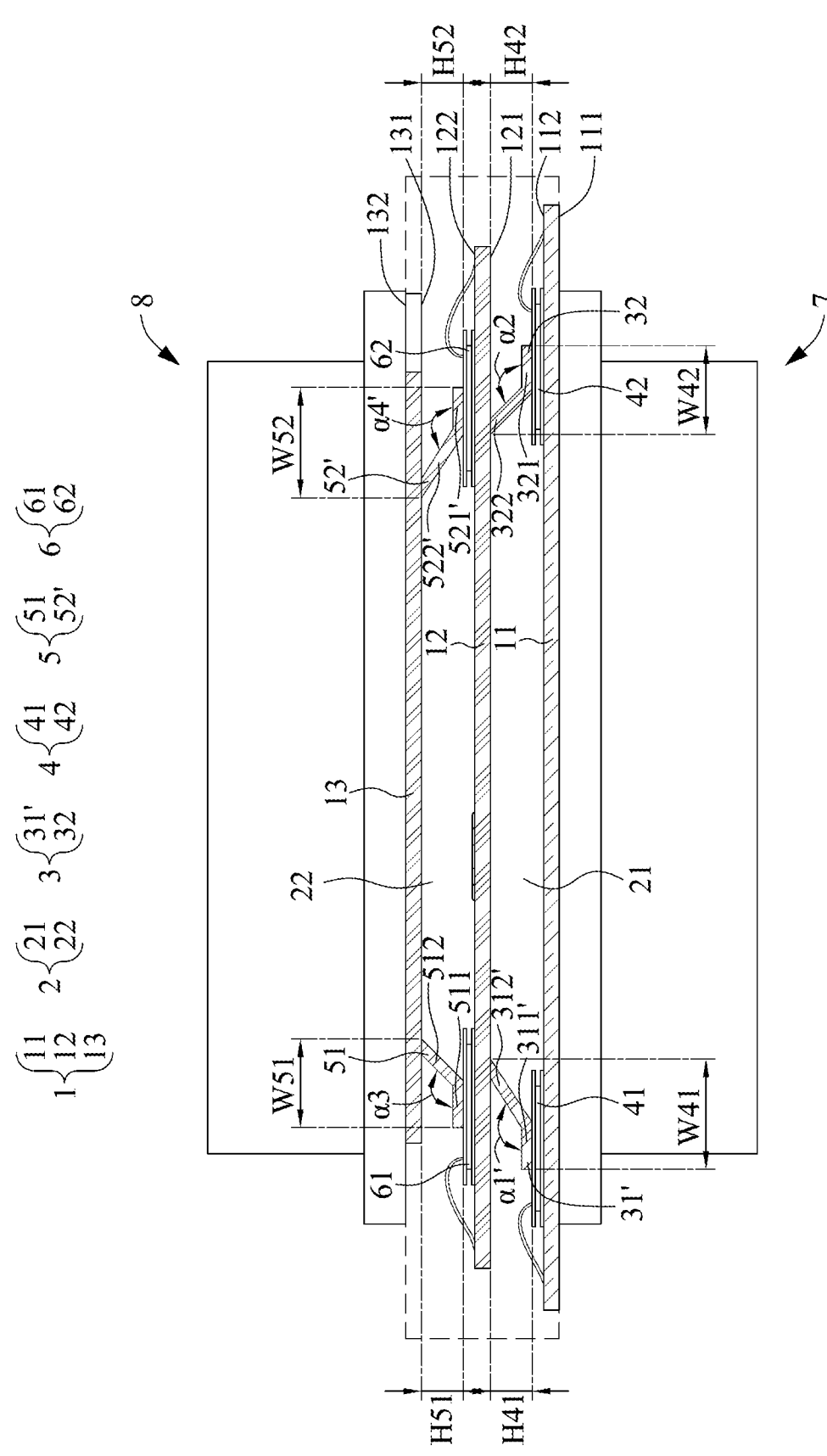
FIG. 14 is a perspective side view of an exemplary electronic device according to some embodiments of the present disclosure.

FIG. 14 is a perspective side view of an exemplary electronic device 200 according to some embodiments of the present disclosure. The electronic device 200 of FIG. 14 may be similar to the electronic device 100 of FIG. 1. Therefore, some detailed descriptions may correspond to preceding paragraphs and are not repeated hereinafter for conciseness, with differences therebetween as follows.

The connecting portion 3 may include a connecting portion (or the clip) 31', instead of the connecting portion 31 of FIG. 1, connected between the conductive plate 12 and the electronic component 41. The connecting portion 31' may have a height H41 and the connecting portion (or the clip) 32 may have a height H42 perpendicular to the surface 121 of the conductive plate 12, and the height H41 and the height H42 may be substantially the same. The connecting portion 31' may have a width W41 and the connecting portion 32 has a width W41 parallel to the surface 121 of the conductive plate 12, and the width W41 and the width W42 are different. The connecting portion 31' may have a first section 311' disposed below the surface 121 of the conductive plate 12 and a first extending section 312' which defines an angle α1' with the first section 311'. The angle α2 as defined by the sections 321 and 322 of the connecting portion 32 may be different from the angle α1'. In some embodiments, the angle α1' may be greater than the angle α2.

The connecting portion 5 may include a connecting portion (or the clip) 52', instead of the connecting portion 52 of FIG. 1, connected between the conductive plate 13 and the electronic component 62. The connecting portion 51 may have a height H51 and the connecting portion (or the clip) 52' may have a height H52 perpendicular to the surface 131 of the conductive plate 13, and the height H51 and the height H52 may be substantially the same. The connecting portion 51 may have a width W51 and the connecting portion 52' has a width W52 parallel to the surface 131 of the conductive plate 13, and the width W51 and the width W52 are different. The connecting portion 52' may have a first section 521' disposed below the surface 131 of the conductive plate 13 and a first extending section 522' which defines an angle α4' with the first section 521'. The angle α3 as defined by the sections 511 and 512 of the connecting portion 51 may be different from the first angle α4'. In some embodiments, the angle α4' may be greater than the angle α3.

The flexibility of the clips of the connecting portions 3 and 5 may alleviate the impact from deviations cumulated during the manufacture of the electronic device 100, such as the deviations in size (or the length) between the connecting portions 3 (or the connecting portions 5). As illustrated in FIG. 14, the connecting portions 31' and 32 may have different lengths. Owing to the flexibility of the connecting portions 31' and 32, the extending portion 312' is more oblique than the extending portion 322. In other words, the clips of the connecting portions 3 may deform to compensate the deviations thereof at the same elevation, such that the height along a Z-axis thereof may substantially the same and the upper conductive plate (e.g., the conductive plate 12) would is angled only slightly or not at all. The size tolerance of the electronic device 100 may be controlled in a relatively low level.

Figure 15:
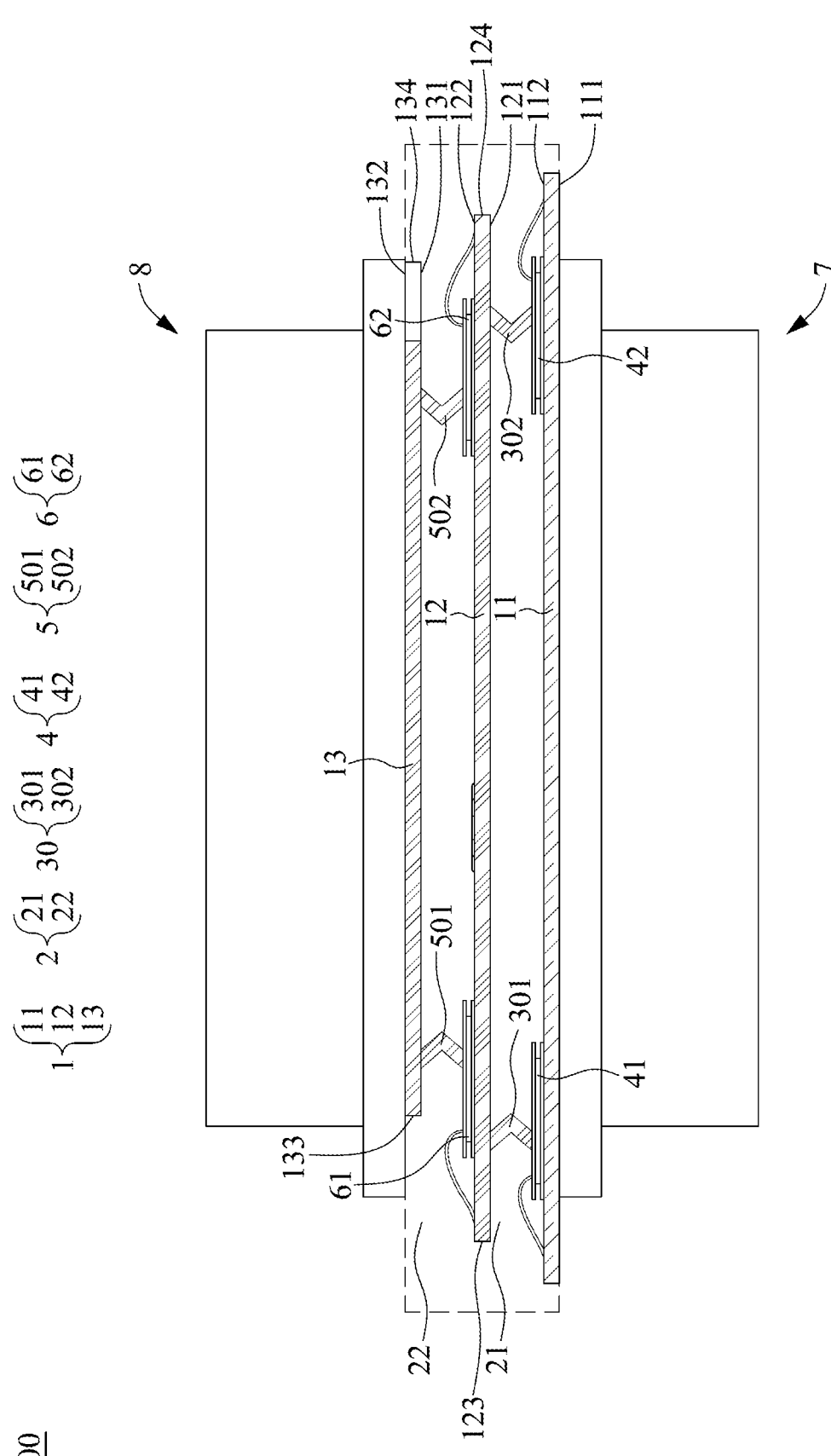
FIG. 15 is a perspective side view of an exemplary electronic device according to some embodiments of the present disclosure.

FIG. 15 is a perspective side view of an exemplary electronic device 300 according to some embodiments of the present disclosure. The electronic device 300 of FIG. 15 may be similar to the electronic device 100 of FIG. 1. Therefore, some detailed descriptions may correspond to preceding paragraphs and are not repeated hereinafter for conciseness, with differences therebetween as follows.

The electronic device 300 may include a plurality of connecting portions 30 and a plurality of connecting portions 50. The connecting portions 30 may disposed between the conductive plate 11 and the conductive plate 12. The connecting portions 50 may disposed between the conductive plate 12 and the conductive plate 13. The connecting portions 30 may include a connecting portion 301 adjacent to the edge 123 of the conductive plate 12 and a connecting portion 302 adjacent to the edge 124 of the conductive plate 12. The connecting portions 301 and 302 may each have a corner at its middle part. A junction of an end of the connecting portion 301 connecting the conductive plate 11 may overlap a junction of another end of the connecting portion 301 connecting the conductive plate 12 perpendicular to the surface 121 of the conductive plate 12. The connecting portion 301 may be electrically connected to the electronic component 41 and configured to buffer stress from the conductive plate 12 to the electronic component 41. A junction of an end of the connecting portion 302 connecting the conductive plate 11 may overlap a junction of another end of the connecting portion 302 connecting the conductive plate 12 perpendicular to the surface 121 of the conductive plate 12. The connecting portion 302 may be electrically connected to the electronic component 42 and configured to buffer stress from the conductive plate 12 to the electronic component 42.

The connecting portions 50 may include a connecting portion 501 adjacent to the edge 133 of the conductive plate 13 and a connecting portion 502 adjacent to the edge 134 of the conductive plate 13. The connecting portions 501 and 502 may each have a corner at its middle part. A junction of an end of the connecting portion 501 connecting the conductive plate 12 may overlap a junction of another end of the connecting portion 501 connecting the conductive plate 13 perpendicular to the surface 131 of the conductive plate 13. The connecting portion 501 may be electrically connected to the electronic component 41 and configured to buffer stress from the conductive plate 13 to the electronic component 61. A junction of an end of the connecting portion 502 connecting the conductive plate 12 may overlap a junction of another end of the connecting portion 502 connecting the conductive plate 13 perpendicular to the surface 131 of the conductive plate 13. The connecting portion 502 may be electrically connected to the electronic component 62 and configured to buffer stress from the conductive plate 13 to the electronic component 62.

FIG. 16 is a flowchart of an exemplary method 400 of manufacturing an electronic device (e.g., the electronic device 100, 200, or 300) according to some embodiments of the present disclosure.

The method 400 begins with operation 5401 including forming a first conductive plate (e.g., the conductive plate 11). Operation 5401 may further include forming a plurality of electronic components 4 on and electrically connected to the first conductive plate.

The method 400 continues with operation 5403 including forming a first connecting portion (e.g., one of the connecting portions 3) by stamping a second conductive plate (e.g., the conductive plate 12).

The method 400 continues with operation 5405 including attaching the second conductive plate to the first conductive plate through the first connecting portion.

The method 400 continues with operation 5407 including forming a second connecting portion (e.g., one of the connecting portions 5) by stamping a second conductive plate (e.g., the conductive plate 13).

The method 400 continues with operation 5409 including attaching the second conductive plate to the first conductive plate through the first connecting portion.

The method 400 continues with operation 5211 including forming a molding (e.g., the protective layer 2) to cover the first conductive plate, the second conductive plate, and the third conductive plate. In some embodiments, the molding may flow through a window element of the second conductive plate. Owing to the window element providing a path for the molding, the molding process of the conductive plates may be complete in a single step (e.g., the transfer molding). Furthermore, the window element may be configured to control or balance the flow of the molding above or below the second conductive plate. During the formation of the molding, a mold (or a head of a tool) would apply force to the top conductive plate (e.g., the third conductive plate) and the connecting portions 3 and 5 may experience the stress from the top conductive plate and subsequently deform to buffer the stress from the top conductive plate to the electronic components 4 and 6.

The method 400 is merely an example, and is not intended to limit the present disclosure beyond what is explicitly recited in the claims. Additional operations can be provided before, during, or after each operation of the method 400, and some operations described can be replaced, eliminated, or reordered for additional embodiments of the method. In some embodiments, the method 400 can include further operations not depicted in FIG. 16. In some embodiments, the method 400 can include one or more operations depicted in FIG. 16.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a first conductive plate including a first connecting portion;

a first electronic component supporting the first conductive plate through the first connecting portion, wherein the first connecting portion is electrically connected to the first electronic component and configured to buffer stress from the first conductive plate to the first electronic component; and a second electronic component disposed above the first conductive plate and configured to electrically connect the first electronic component through the first connecting portion, wherein the first conductive plate includes:

a second connecting portion;

a first opening, wherein the first connecting portion extends downward from the first opening; and a second opening, wherein the second connecting portion extends downward from the second opening, wherein the second electronic component is disposed between the first opening and the second opening.

2. The electronic device of claim 1, wherein the first connecting portion includes a spring element.

3. The electronic device of claim 2, wherein the first connecting portion includes a clip.

4. The electronic device of claim 1, wherein the first connecting portion comprises:

a first end connected to the first conductive plate, and a second end connected to the first electronic component and partially non-overlapping with the first end from a cross-sectional view.

5. The electronic device of claim 1, wherein the first connecting portion has an end connected to the first electronic component, and wherein the end of the first connecting portion and a bottom surface of the first conductive plate define a space.

6. The electronic device of claim 1, wherein the first connecting portion extends from the first conductive plate to a location under the first opening.

7. The electronic device of claim 1, further comprising:

a second conductive plate disposed above the second electronic component and including a third connecting portion electrically connected to the second electronic component, wherein the third connecting portion of the second conductive plate is configured to buffer the stress from the second conductive plate to the second electronic component.

8. The electronic device of claim 7, wherein the third connecting portion of the second conductive plate is non-overlapping with the first connecting portion of the first conductive plate from a top view.

9. An electronic device, comprising:

a first conductive plate including a first connecting portion;

a first electronic component supporting the first conductive plate through the first connecting portion, wherein the first connecting portion is electrically connected to the first electronic component and configured to buffer stress from the first conductive plate to the first electronic component; and a second electronic component disposed above the first conductive plate and configured to electrically connect the first electronic component through the first connecting portion, wherein each of the first electronic component and the second electronic component comprises a power transistor, and wherein the first connecting portion connects a drain terminal of the second electronic component to a source terminal of the first electronic component.

10. An electronic device, comprising:

a first conductive plate including a first connecting portion;

a first electronic component supporting the first conductive plate through the first connecting portion, wherein the first connecting portion is electrically connected to the first electronic component and configured to buffer stress from the first conductive plate to the first electronic component;

a second electronic component disposed above the first conductive plate;

a second conductive plate disposed above the second electronic component and including a third connecting portion electrically connected to the second electronic component, wherein the third connecting portion of the second conductive plate is configured to buffer the stress from the second conductive plate to the second electronic component; and a third electronic component disposed between the first conductive plate and the second conductive plate, wherein each of the third electronic component and the second electronic component comprises a power transistor, and wherein the second conductive plate connects a drain terminal of the third electronic component to a drain of the second electronic component.

11. The electronic device of claim 1, further comprising a first heat dissipation structure disposed below the first electronic component and configured to dissipate heat from the first electronic component.

12. The electronic device of claim 1, further comprising a second heat dissipation structure above the second electronic component and configured to dissipate heat from the second electronic component.

13. The electronic device of claim 1, further comprising a protective layer covering the first electronic component and the second electronic component, wherein the first conductive plate has a through hole, wherein the protective layer is at least partially within the through hole.

14. The electronic device of claim 7, wherein the first conductive plate comprises a first opening and the second conductive plate comprises a third opening, and wherein, in a top view, the first opening misaligns with the third opening.

15. The electronic device of claim 7, further comprising a third conductive plate below the first conductive plate, wherein the first electronic component is disposed between the third conductive plate and the first conductive plate.

16. The electronic device of claim 15, wherein a distance between the first conductive plate and the second conductive plate is substantially equal to a distance between the first conductive plate and the third conductive plate.

17. The electronic device of claim 1, wherein the first connecting portion has a section non-perpendicular to the first electronic component.

18. The electronic device of claim 17, wherein the first connecting portion has an oblique surface with respect to the first conductive plate.

* * * * *